United States Patent
Sei et al.

(10) Patent No.: US 9,112,149 B2
(45) Date of Patent: Aug. 18, 2015

(54) MEMORY ELEMENT AND METHOD OF MANUFACTURING THE SAME, AND MEMORY DEVICE

(75) Inventors: Hiroaki Sei, Kanagawa (JP); Shuichiro Yasuda, Kanagawa (JP); Masayuki Shimuta, Kanagawa (JP); Katsuhisa Aratani, Kanagawa (JP); Akira Kouchiyama, Kanagawa (JP); Tetsuya Mizuguchi, Kanagawa (JP); Kazuhiro Ohba, Tokyo (JP)

(73) Assignee: SONY CORPORATION, Tokyo (JP)

( * ) Notice: Subject to any disclaimer, the term of this patent is extended or adjusted under 35 U.S.C. 154(b) by 163 days.

(21) Appl. No.: 13/310,830

(22) Filed: Dec. 5, 2011

(65) Prior Publication Data
US 2012/0145987 A1   Jun. 14, 2012

(30) Foreign Application Priority Data

Dec. 13, 2010  (JP) ................................ 2010-276749
Jun. 2, 2011   (JP) ................................ 2011-124610

(51) Int. Cl.
*H01L 21/20*     (2006.01)
*H01L 45/00*     (2006.01)

(52) U.S. Cl.
CPC ............... *H01L 45/14* (2013.01); *H01L 45/08* (2013.01); *H01L 45/1233* (2013.01); *H01L 45/1625* (2013.01); *H01L 45/1641* (2013.01)

(58) Field of Classification Search
CPC . H01L 45/08; H01L 45/1233; H01L 45/1641; H01L 45/1625; H01L 45/14; H01L 21/20
USPC .......................... 257/2, 5, E45.002; 438/382
See application file for complete search history.

(56) References Cited

U.S. PATENT DOCUMENTS

| | | | |
|---|---|---|---|
| 2005/0226036 A1* | 10/2005 | Aratani et al. | 365/158 |
| 2006/0245235 A1 | 11/2006 | Krieger et al. | |
| 2008/0219039 A1 | 9/2008 | Kumar et al. | |
| 2010/0259967 A1* | 10/2010 | Yasuda et al. | 365/148 |
| 2011/0140065 A1* | 6/2011 | Maesaka et al. | 257/2 |
| 2011/0227026 A1* | 9/2011 | Sekar et al. | 257/4 |
| 2011/0261606 A1* | 10/2011 | Sandhu et al. | 365/148 |

FOREIGN PATENT DOCUMENTS

| | | | |
|---|---|---|---|
| JP | 2008-510318 | | 4/2008 |
| JP | 2008135659 A | * | 6/2008 |
| JP | 2008-251108 | | 10/2008 |
| JP | 2009-043905 | | 2/2009 |
| JP | 2009-141151 | | 6/2009 |

(Continued)

OTHER PUBLICATIONS

Japanese Office Action dated Oct. 28, 2014, issued in connection with counterpart Japanese Patent Application No. 2011-124610.

*Primary Examiner* — Asok K Sarkar
*Assistant Examiner* — Dmitriy Yemel Yanov
(74) *Attorney, Agent, or Firm* — Dentons US LLP

(57) ABSTRACT

A memory element with reduced degradation of memory characteristics that is caused by deterioration of a memory layer, a method of manufacturing the memory element, and a memory device are provided. The memory element includes a first electrode, a memory layer, and a second electrode in this order. The memory layer includes a resistance change layer containing fluoride, and an ion source layer disposed between the resistance change layer and the second electrode.

13 Claims, 19 Drawing Sheets

(56) References Cited

FOREIGN PATENT DOCUMENTS

| | | |
|---|---|---|
| JP | 2009-164467 | 7/2009 |
| JP | 2010-278275 | 12/2010 |
| WO | 2009-122583 A1 | 10/2009 |
| WO | 2009-154266 A1 | 12/2009 |

* cited by examiner

EXAMPLE 1

EXAMPLE 4

EXAMPLE 5

COMPARATIVE EXAMPLE 1

COMPARATIVE EXAMPLE 2

EXAMPLE 6

EXAMPLE 7

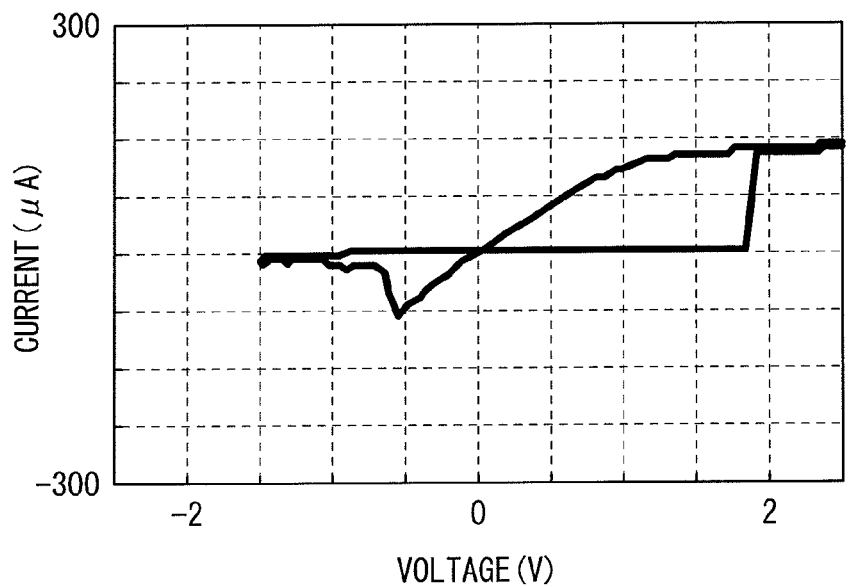
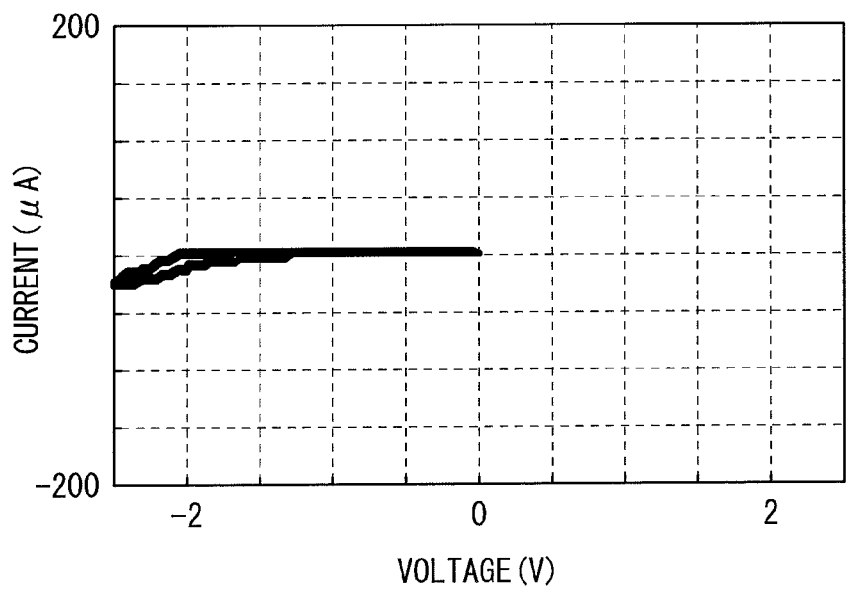

EXAMPLE 9

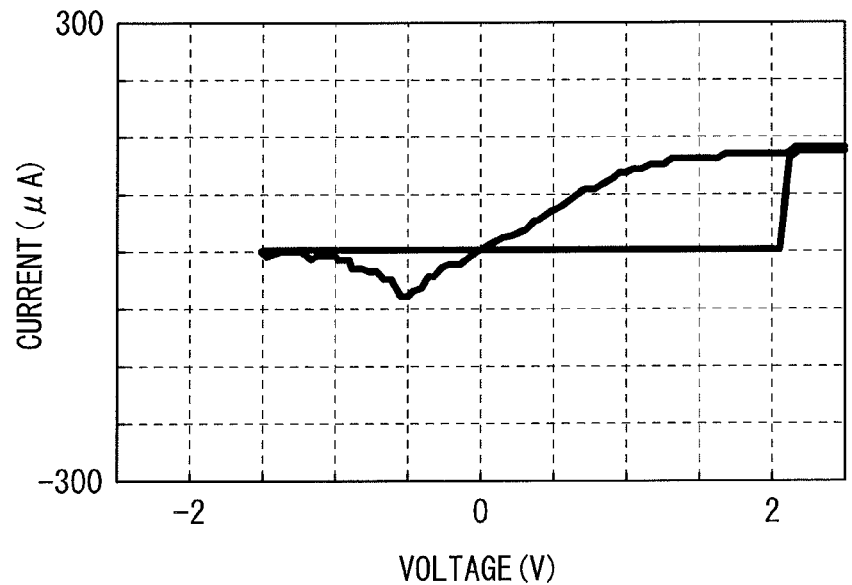
FIG. 16A COMPARATIVE EXAMPLE 3
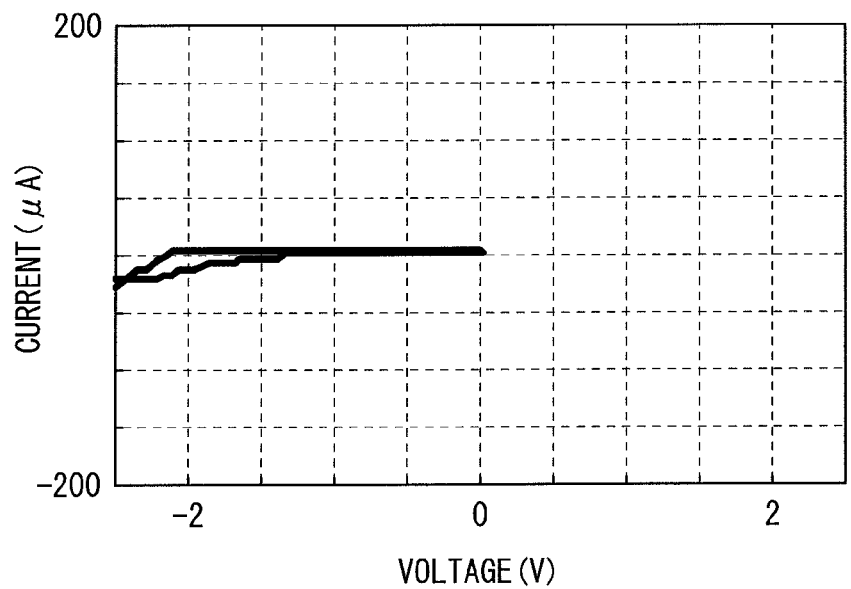
FIG. 16B

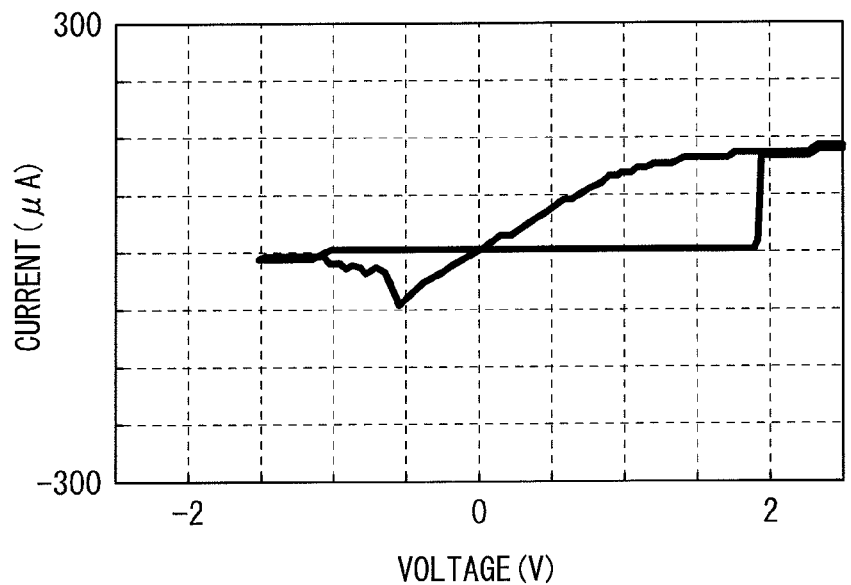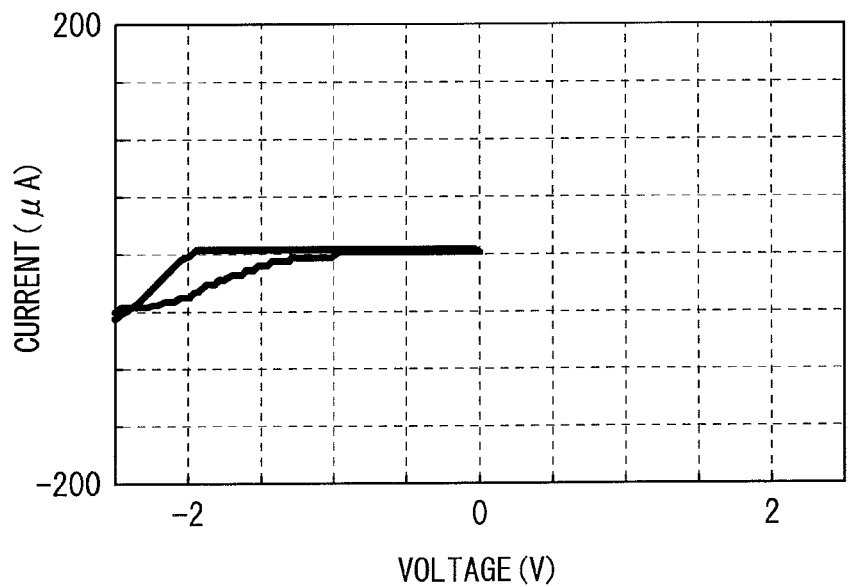

MEMORY ELEMENT AND METHOD OF MANUFACTURING THE SAME, AND MEMORY DEVICE

BACKGROUND

The present technology relates to a memory element storing information based on any change of electrical characteristics observed in a memory layer including an ion source layer and a resistance change layer, to a method of manufacturing the same, and to a memory device.

A semiconductor nonvolatile memory popularly used for data storage has been a NOR or NAND flash memory. Such a semiconductor nonvolatile memory, however, has been pointed out that there are limitations on microfabrication considering the need for a high level of voltage for writing and erasing, and the limited number of electrons for injection to a floating gate.

For overcoming such limitations on microfabrication, a next-generation nonvolatile memory currently proposed is a ReRAM (Resistance Random Access Memory) or a PRAM (Phase-Change Random Access Memory), for example. These resistance change memories are each formed therein with a conductive path through migration of atoms or ions by heat or an electric field, and are each supposed to show a change of resistance value.

As an example, Japanese Unexamined Patent Application Publication No. 2009-141151 describes a memory element including an ion source layer and a high-resistance layer (resistance change layer) between two electrodes. The ion source layer contains a chalcogenide element and a metallic element, and the high-resistance layer is a gadolinium oxide film. In the memory element, application of a voltage causes the metallic element (ions) to move, thereby forming a conductive path in the high-resistance layer.

SUMMARY

However, in the resistance change memory described in Japanese Unexamined Patent Application Publication No. 2009-141151, a high level of voltage is applied to any portion with no ion migration at the time of the formation of the conductive path and the disappearance thereof, thereby causing deterioration of the high-resistance layer being the gadolinium oxide film. The deterioration of the high-resistance layer as such also affects the memory characteristics, i.e., a disadvantage of so-called dielectric strength in the resistance change memory.

It is thus desirable to provide a memory element with reduced degradation of memory characteristics that is caused by deterioration of a memory layer, a method of manufacturing the memory element, and a memory device.

A first memory element according to an embodiment of the present technology includes a first electrode, a memory layer, and a second electrode in this order. The memory layer includes a resistance change layer containing fluoride, and an ion source layer disposed between the resistance change layer and the second electrode.

A second memory element according to another embodiment of the present technology includes a first electrode, a memory layer, and a second electrode in this order. The memory layer includes a resistance change layer on the first electrode side, and an ion source layer disposed between the resistance change layer and the second electrode. The first electrode contains fluorine (F) or phosphorus (P). A method of manufacturing a memory element according to still another embodiment of the present technology is a method of manufacturing the second memory element in the above.

First and second memory devices according to still another embodiment of the present technology each include a plurality of memory elements each including a first electrode, a memory layer, and a second electrode in this order, and a pulse application section applying a voltage or current pulse selectively to the memory elements. Each of these memory elements is configured of either the first or second memory element described above.

With the first and second memory elements (memory devices) according to the embodiments of the present technology, when a voltage or current pulse of "positive direction" (e.g., the first electrode side is at a negative potential, and the second electrode side is at a positive potential) is applied with respect to the element in the initial state (high-resistance state), any metallic element contained in the ion source layer is ionized and diffused in the resistance change layer, and then is deposited by bonding with electrons at the first electrode, or remains in the resistance change layer and forms an impurity level. As a result, a conductive path containing the metallic element is formed in the memory layer, thereby decreasing the resistance of the resistance change layer (state of writing). When a voltage pulse of "negative direction" (e.g., the first electrode side is at a positive potential, and the second electrode side is at a negative potential) is applied with respect to the element in the low-resistance state as such, the metallic element that has been deposited on the first electrode is ionized, and then is dissolved into the ion source layer. As a result, the conductive path containing the metallic element disappears, and the resistance change layer is increased in resistance (initial state or state of erasing). Herein, since the resistance change layer contains fluoride, or since the first electrode contains fluorine or phosphorus, even if a high level of voltage is applied for a change of state to writing or erasing, the influence thereof is little.

With the first and second memory elements (memory devices) according to the embodiments of the present technology, and the method of manufacturing the memory element according to another embodiment of the present technology, since the resistance change layer contains fluoride, or since the first electrode contains fluorine or phosphorus, the application of a voltage has little influence. As such, the memory characteristics are protected from degradation that is to be caused by deterioration of the resistance change layer.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 14A and 14B are each a characteristics diagram showing an exemplary current-voltage relationship in a memory element of Example 8.

FIGS. 16A and 16B are each a characteristics diagram showing an exemplary current-voltage relationship in a memory element of Comparative Example 3.

FIGS. 17A and 17B are each a characteristics diagram showing an exemplary current-voltage relationship in a memory element of Comparative Example 4.

DETAILED DESCRIPTION OF THE PREFERRED EMBODIMENTS

In the below, by referring to the accompanying drawings, embodiments of the present technology are described in detail. Herein, the description is given in the following order.
1. First Embodiment (Memory Element: a memory element in which a memory layer is configured by an ion source layer and a resistance change layer, and the resistance change layer contains fluoride)
2. Modification (Memory Element: a memory element in which an ion source layer is configured by an ion supply layer and an intermediate layer)
3. Second Embodiment (Memory Element: a memory element in which a lower electrode contains fluorine or phosphorus)
4. Memory Device
5. Examples

First Embodiment

Memory Element

Figure 1:
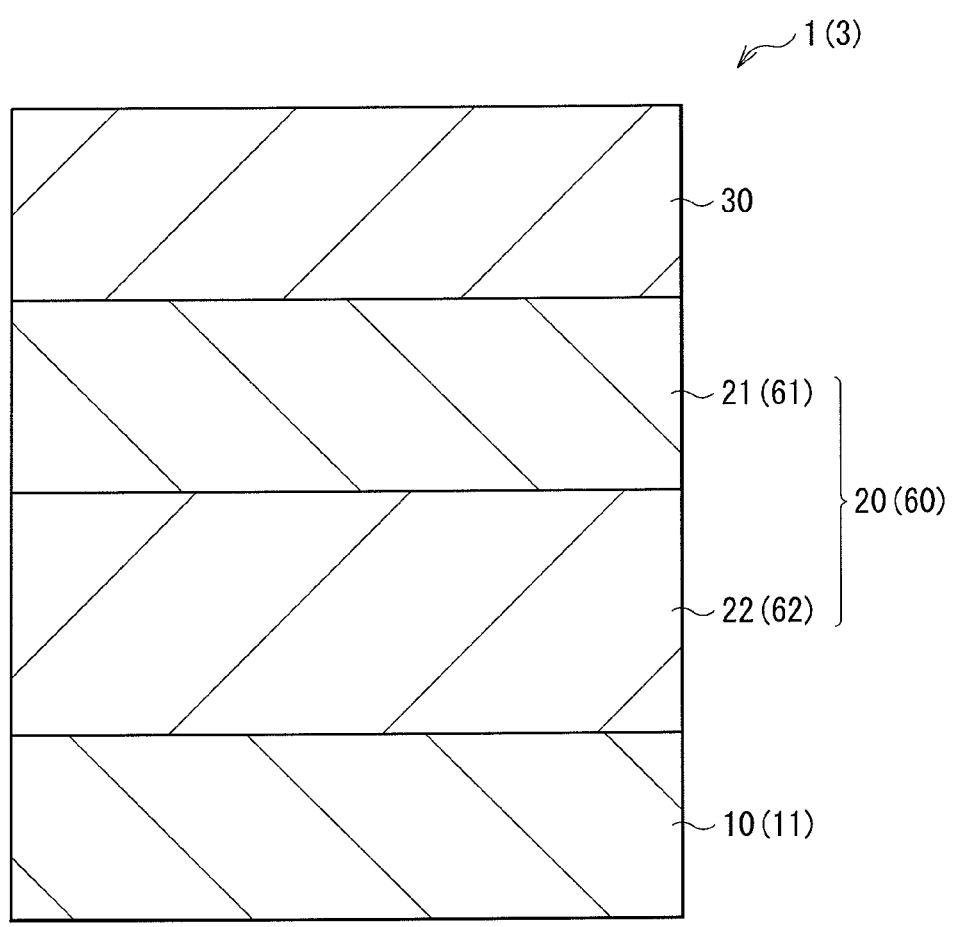
FIG. 1 is a cross-sectional view of a memory element in first and second embodiments of the present disclosure, showing the configuration thereof.

FIG. 1 is a cross-sectional view of a memory element 1 in a first embodiment of the present disclosure, showing the configuration thereof. This memory element 1 is configured to include a lower electrode 10 (first electrode), a memory layer 20, and an upper electrode 30 (second electrode) in this order.

The lower electrode 10 is provided on a substrate 41 formed with a CMOS (Complementary Metal Oxide Semiconductor) circuit as will be described later (FIG. 3), for example, thereby serving as a connection section with the portion of the CMOS circuit. This lower electrode 10 is made of a material for wiring use in the semiconductor process, e.g., W (tungsten), WN (tungsten nitride), TiN (titanium nitride), Cu (copper), Al (aluminum), Mo (molybdenum), Ta (tantalum), and silicide. When the lower electrode 10 is made of a material such as copper that possibly causes ion conduction in an electric field, the lower electrode 10 made of copper or others as such may be covered on the surface with a material that hardly causes ion conduction or thermal diffusion, e.g., tungsten, tungsten nitride, titanium nitride, and tantalum nitride (TaN). When an ion source layer 21 that will be described later contains aluminum, preferably used is a metal film containing one or more of chromium (Cr), tungsten, cobalt (Co), silicon (Si), gold (Au), palladium (Pd), molybdenum, iridium (Ir), titanium (Ti), and others that are more resistant to ionization than aluminum, or an oxide or nitride film thereof.

The memory layer 20 is configured by the ion source layer 21 on the upper electrode 30 side, and a resistance change layer 22 on the lower electrode 10 side. In this embodiment, the ion source layer 21 is in contact with the upper electrode 30, and the resistance change layer 22 is in contact with the lower electrode 10.

The ion source layer 21 is disposed between the resistance change layer 22 and the upper electrode 30, and contains an element to be converted into mobile ions (cations and anions) that diffuse to the resistance change layer 22. The element that is possibly cationized includes one or two or more of metallic elements such as copper, aluminum, germanium (Ge), and zinc (Zn). As an ion conductive material that is to be anionized includes at least one or more of elements in group 16 (chalcogen elements) including oxygen (O), tellurium (Te), sulfur (S), and selenium (Se), for example. The metallic element(s) and the chalcogen element(s) are bonded together, thereby forming a metal chalcogenide layer. This metal chalcogenide layer is mainly in the amorphous structure, and serves as an ion supply source.

As for the metallic element that is possibly cationized, as is reduced on the cathode electrode (e.g., the lower electrode 10) during the operation of writing and forms a conductive path (filament) in the form of metal, any element chemically stable is preferable, i.e., remains in the form of metal in the ion source layer 21 containing the chalcogen element(s) described above. Such a metallic element includes, other than those metallic elements described above, transition metallic elements of groups 4A, 5A, and 6A in the periodic table, i.e., titanium, zirconium (Zr), hafnium (Hf), vanadium (V), niobium (Nb), tantalum, chromium, molybdenum, and tungsten, for example. Among these elements, one or two or more are possibly used. Alternatively, silver (Ag), silicon, or others may be used as additive elements to the ion source layer 21.

The specific material of the ion source layer 21 as such contains ZrTeAl, TiTeAl, CrTeAl, WTeAl, TaTeAl, and others. Such specific materials may also include CuZrTeAl being a result of addition of copper to ZrTeAl, CuZrTeAlGe being a result of addition of germanium to CuZrTeAl, and CuZrTeAlSiGe being a result of addition of another additive element to CuZrTeAlGe. Another option is ZrTeMg including magnesium as an alternative to aluminum. As for the ionizing metallic element, any similar additive element is possibly used even if a transition metallic element selected for use as the ionizing metallic element is not zirconium but titanium or tantalum, e.g., TaTeAlGe. Moreover, as for the ion conductive material, tellurium is surely not restrictive, and sulfur, selenium, or iodine (I) may be also used, i.e., specifically ZrSAl, ZrSeAl, ZrIAl, CuGeTeAl, and others. Herein, aluminum is not necessarily contained, and CuGeTeZr or others may be also used.

Note that the ion source layer 21 may be added with any other elements for the purpose of preventing peeling of film during a high-temperature heat treatment for the memory layer 20, for example. Silicon is an exemplary additive element that possibly offers also the improvement of retention characteristics, and is preferably added to the ion source layer 21 together with zirconium. Herein, if the content of silicon for addition is not enough, the effect of preventing the film peeling is not sufficiently produced, and if the content thereof is too much, the resulting memory operation characteristics are not satisfactory enough. In consideration thereof, the content of silicon in the ion source layer 21 is preferably in the range of about 10 to 45%.

The resistance change layer 22 is disposed between the ion source layer 21 and the lower electrode 10. This resistance change layer 22 serves as a barrier against electric conduction, and when a predetermined level of voltage is applied between the lower and upper electrodes 10 and 30, the resistance value thereof shows a change.

In this embodiment, this resistance change layer 22 contains fluoride. Since fluorine (F) has a high level of electronegativity, the fluoride often contains component elements strongly bonded together like ionic bonding. With the provision of fluoride as such, the resulting resistance change layer 22 is not much susceptible to application of a voltage, e.g., to repeated application of a voltage, to an abrupt change of level of voltage application, or to application of a high level of voltage, and is favorably protected from deterioration. In other words, the resulting resistance change layer 22 is possibly with improved characteristics of dielectric strength more than ever before. From the viewpoint of improving the characteristics of dielectric strength as such, the resistance layer 22 is preferably provided with 5% or more of fluoride at the time of manufacturing, and more preferably, the resistance layer 22 is formed only by fluoride. This is because the content of fluoride of 5% or more allows the network formation of fluoride oxide in the resistance change layer 22.

As described above, the fluoride contained in the resistance change layer 22 is preferably strong in bonding force between the component elements. The fluoride also preferably has a high resistance value because the resistance change layer 22 serves as a barrier against electric conduction. The fluoride is often with a large band gap and is often high in resistance value. To be specific, the fluoride for use preferably includes lithium fluoride (LiF) or potassium fluoride (KF) being alkali metal fluoride, magnesium fluoride ($MgF_2$), calcium fluoride ($CaF_2$), strontium fluoride ($SrF_2$), or barium fluoride ($BaF_2$) being alkaline-earth metal fluoride, aluminum fluoride ($AlF_3$) or gallium fluoride ($GaF_3$) being group-13 element fluoride (earth metal), lanthanum fluoride ($LaF_3$), cerium fluoride ($CaF_3$), praseodymium fluoride ($PrF_3$), neodynium fluoride ($NdF_3$), samarium fluoride ($SmF_3$), europium fluoride ($EuF_3$), gadolinium fluoride ($GdF_3$), holmium fluoride ($HoF_3$), erbium fluoride ($ErF_3$), thulium fluoride ($TmF_3$), or ytterbium fluoride ($YbF_3$) being lanthanide fluoride, or others such as cadmium fluoride ($CdF_2$) or yttrium fluoride ($YF_3$). Most of all, using fluoride being the combination of fluorine and any highly-ionizable element is preferable, and considering the characteristics of dielectric strength, the high resistance, and the ease of handling, using magnesium fluoride, calcium fluoride, aluminum fluoride, or lithium fluoride is more preferable. Each compound is with a band gap as below. That is, magnesium fluoride is with a band gap of 6 eV, calcium fluoride is with a band gap of 10 eV, aluminum fluoride is with a band gap of 11 eV, and lithium fluoride is with a band gap of 11 eV. Herein, sodium fluoride (NaF) is also a possibility for use as long as it is in the state of high resistance value with addition of an additive, for example. Note here that some resistance value of the resistance change layer 22 may increase too much the threshold voltage for writing. Therefore, the resistance change layer 22 is preferably adjusted to have the initial resistance value of 1Ω or larger but 1 GΩ or smaller. The resistance change layer 22 may contain one or two or more types of fluoride.

Moreover, the resistance change layer 22 is preferably oxidized by plasma oxidation or others, and contains oxygen (O). As will be described later, the resistance change layer 22 is formed by deposition of fluoride by sputtering, but the fluoride may possibly be reduced partially at the time of deposition of fluoride as such. Therefore, by oxidization after the deposition as such, the resulting resistance change layer 22 is expected to be stable, and as a result, the resulting memory element 1 is with the excellent memory characteristics. Instead of being oxidized, the resistance change layer 22 may be formed of a compound containing fluorine and oxygen. Still alternatively, the resistance change layer 22 may contain any other element such as nitrogen (N).

The upper electrode 30 may be made of a material similar to that of the lower electrode 10, i.e., a well-known material for use of semiconductor, and preferably, be made of a stable material not reacting with the ion source layer 21 even after post-annealing.

With such a memory element 1 of the embodiment, when a voltage or current pulse is applied by a power supply circuit (pulse application section; not shown) via the lower and upper electrodes 10 and 30, the memory layer 20 shows a change of the electrical characteristics thereof, e.g., change of the resistance value, thereby performing information writing, erasing, and reading. In the below, such an operation is described specifically.

First of all, a positive voltage is applied to the memory element 1 such that the upper electrode 30 side is at a positive potential, and the lower electrode 10 side is at a negative potential, for example. In response thereto, any metallic element in the ion source layer 21 is ionized and diffused to the resistance change layer 22, and then is deposited by bonding with electrons on the lower electrode 10 side, or the ionized metallic element remains in the resistance change layer 22, and forms an impurity level. As a result, a conductive path is formed on the interface between the lower electrode 10 and the memory layer 20. This conductive path is made of a low-resistance metallic element reduced in the form of metal. This accordingly decreases the resistance value of the memory layer 20, i.e., the memory layer 20 shows a decrease of resistance value to be lower (to be in the low-resistance state) than that in the initial state (in the high-resistance state).

Thereafter, even if the memory element 1 becomes free of voltage by stopping the application of the positive voltage, the state of low resistance is retained. This means information writing is done. For use in a once-writable memory device, i.e., a so-called PROM (Programmable Read Only Memory), the memory element 1 is completed with recording only by the process of recording described above.

On the other hand, for application use in an erasable memory device, i.e., RAM (Random Access Memory), EEPROM (Electronically Erasable and Programmable Read Only Memory), or others, a process of erasing is necessary. During the process of erasing, a negative voltage is applied to the memory element 1 such that the upper electrode 30 side is at a negative potential, and the lower electrode 10 side is at a positive potential, for example. In response thereto, in the conductive path formed inside of the memory layer 20, the metallic element is ionized, and the conductive path disappears or becomes narrow so that the resistance value thus shows an increase.

Thereafter, even if the memory element 1 becomes free of voltage by stopping the application of the negative voltage thereto, the resistance value therein remains high. This means erasing of any information written thereto. By repeating such a procedure, the memory element 1 is to be subjected to repeated writing of information and erasing of the written information.

If the state high in resistance value is correlated with information of "0", and if the state low in resistance value is correlated with information of "1", for example, the information of "0" is to be changed to the information of "1" in the process of information recording by the application of a positive voltage, and the information of "1" is to be changed to the information of "0" in the process of information erasing by the application of a negative voltage. Note that, in this example, although the operation of decreasing the resistance of the memory element 1 is correlated with the writing operation and the operation of increasing the resistance thereof is correlated with the erasing operation, the correlation may be inversed.

For demodulation of any recorded data, the larger ratio is more preferable between an initial resistance value and an after-recording resistance value. However, a too large resistance value of the resistance change layer 22 causes a difficulty in writing as described above, i.e., in decreasing the resistance. As a result, since a threshold voltage for writing is increased too much, the initial resistance value is preferably adjusted to be 1 GΩ or smaller. The resistance value of the resistance change layer 22 is possibly controlled by the thickness thereof, for example.

In this embodiment, since the resistance change layer 22 contains fluoride, the resistance change layer 22 is not much susceptible to application of a voltage in the process of writing or erasing, e.g., to repeated application of a voltage or to application of a high level of voltage. More in detail, with the provision of fluorine with a high level of electronegativity in the resistance change layer 22, the resulting resistance change layer 22 becomes not susceptible to application of a voltage because the bonding between component elements therein is enhanced thereby. As such, compared with the previous technology of using a gadolinium oxide film, for example, the resistance change layer 22 has improved characteristics of dielectric strength so that the memory element 1 is possibly protected from degradation of the memory characteristics, which is often caused by deterioration of the resistance change layer 22.

Moreover, in the embodiment, the ion source layer 21 preferably contains zirconium other than the element described above, i.e., copper, aluminum, germanium, or zinc (hereinafter, referred to as copper or others).

Assuming that the ion source layer 21 does not contain zirconium but contain only copper as a metallic element, any copper-only metal filament formed by the operation of writing is easy to dissolve into the ion source layer 21, and in the state of no application of writing voltage pulses (state of data retention), is ionized again and is changed in state to high resistance. On the other hand, when the ion source layer 21 contains zirconium, the zirconium works as an ionizing element together with copper or others, and the conductive path to be formed is a combination of copper or others and zirconium. Zirconium is reduced on the cathode electrode, e.g., the lower electrode 10, during the operation of writing, and forms a filament in the form of metal in the state of low resistance after the writing. The metal filament as a result of reduction of zirconium is not relatively easy to dissolve into the ion source layer 21 containing a chalcogen element, and in the state of writing (state of low resistance), is easy to remain in the state of low resistance compared with the conductive path made of only copper or others.

Further, zirconium dissolved in the ion source layer 21 as ions in the state of erasing is lower in ionic mobility at least than copper, and does not easily move even if the temperature is increased or even if it is left as it is for a long time. In other words, zirconium is resistant to deposition on the cathode electrode, e.g., on the lower electrode 10, and remains in the state of high resistance. As such, combining copper or others with zirconium favorably contributes to the improvement of the characteristics of resistance value retention.

Still further, the ion source layer 21 preferably contains aluminum. During the process of erasing, when a negative voltage is applied to the memory element 1 such that the upper electrode 30 side is at a negative potential, and the lower electrode 10 side is at a positive potential, for example, the aluminum contained in the ion source layer 21 moves to the upper electrode 30 side, and an oxide film is formed on the interface with the upper electrode 30. With the oxide film of aluminum being stable as such, the state of high resistance (state of erasing) is stabilized. Herein, as an alternative to aluminum, the oxide film may contain germanium or others with the similar functioning.

As described above, when the ion source layer 21 contains aluminum, germanium, or zirconium, the characteristics of resistance value retention are possibly improved thereby. Accordingly, if any resistance state intermediate between high and low is retained with a good stability through utilization of the high characteristics of resistance value retention as such, the resulting memory element is capable not only of binary storage but also of multivalued storage. Herein, such an intermediate state is possibly created through adjustment of an erasing voltage during a change of resistance from high to low, or through adjustment of the amount of atoms for deposition by changing a write current during a change of resistance from high to low.

Such characteristics important for the operation of memory, i.e., the characteristics of operation of writing and erasing, and the characteristics of resistance value retention, vary depending on the type and the addition content of an element in the ion source layer 21.

If the addition content of zirconium is not enough, the effect of the resistance value retention described above is not produced enough. In consideration thereof, the content of zirconium in the ion source layer 21 is preferably 7.5 atomic % or more. On the other hand, if the addition content of zirconium is too much, this reduces too much the resistance value of the resulting ion source layer 21, thereby failing in application of a voltage effectively to the ion source layer 21. In consideration thereof, the content of zirconium in the ion source layer 21 is preferably 7.5 atomic % or more but 26 atomic % or less.

Adding an appropriate content of copper to the ion source layer 21 facilitates amorphization thereof, and as described above, a combination of copper and zirconium improves the characteristics of resistance value retention. Therefore, adding copper to the ion source layer 21 is preferable.

As described above, in view of the characteristics of resistance value retention, the ion source layer 21 preferably contains aluminum, and the content thereof is preferably 30 atomic % or more for producing the good effect. On the other hand, if the content of aluminum is too much, the aluminum ions become easy to move, thereby creating the state of writing due to reduction of the aluminum ions. Since aluminum is not stable enough in the form of metal in the chalcogenide solid electrolyte, the characteristics of low-resistance writing state retention are degraded. In consideration thereof, the content of aluminum in the ion source layer 21 is preferably 30 atomic % or more but 50 atomic % or less.

Herein, germanium is not necessarily contained, but when germanium is to be added, the content thereof is preferably 15 atomic % or less considering that too much content of germanium degrades the characteristics of writing retention.

In the below, the method of manufacturing the memory element 1 in the embodiment is described.

First of all, on a substrate 41 (FIG. 3 that will be described later) formed with a CMOS circuit such as a selection transistor, a plug of the lower electrode 10 made of titanium nitride or others is formed. Thereafter, if necessary, any oxides or others on the surface of the lower electrode 10 are removed by reverse sputtering, for example.

Next, the resistance change layer 22 is formed by deposition of magnesium fluoride with the thickness of 2.0 nm, for example, and then the formation of layers is performed up to the upper electrode 30 including the ion source layer 21 in succession through exchange of targets in a device for sputtering. The upper electrode 30 is made of zirconium, and the ion source layer 21 is made of CuZrTeAl with the thickness of 45 nm. The targets herein are those each with the composition adapted for the material of the corresponding layer. The diameter of the electrode is 50 to 300 nmφ. A film of alloy is formed at the same time using targets of component elements.

After the formation of the layers up to the upper electrode 30, a wiring layer (not shown) is formed for connection to the upper electrode 30, and a contact section is connected to achieve a common potential among all of the memory elements 1. Thereafter, the layered film is subjected to a post-annealing treatment. As such, the memory element 1 of FIG. 1 is completed.

As such, in the embodiment, the resistance change layer 22 is so configured as to contain fluoride so that the resulting resistance change layer 22 becomes not much susceptible to a repeated application of a voltage and to application of a high level of voltage in the process of writing or erasing. Accordingly, the resistance change layer 22 has improved characteristics of dielectric strength more than ever so that the memory element 1 is possibly protected from degradation of the memory characteristics, which is caused by deterioration of the resistance change layer 22.

In the below, described are a modification of the embodiment described above, and other embodiments. In the following description, any component similar to that in the embodiment described above is provided with the same reference numeral, and is not described again if appropriate.

Modification

Figure 2:
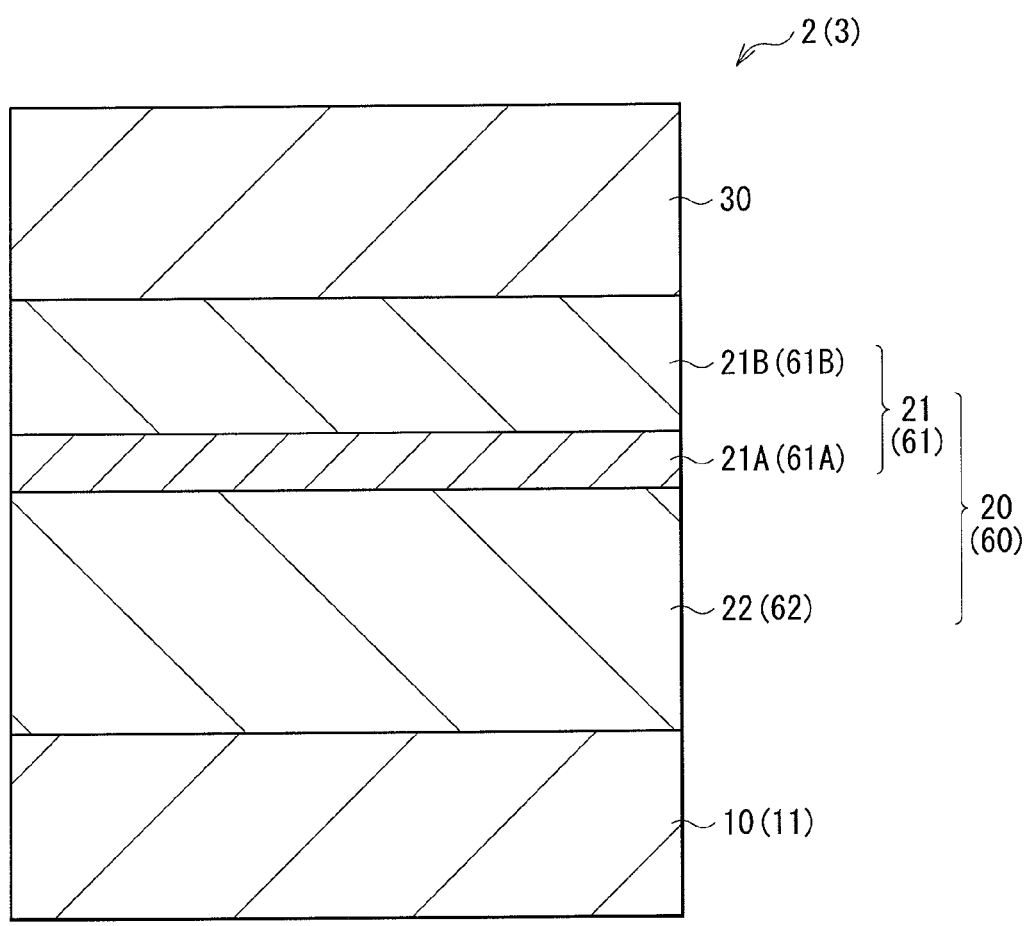
FIG. 2 is a cross-sectional view of a modification of the memory element of FIG. 1, showing the configuration thereof.

FIG. 2 shows the cross-sectional configuration of a memory element (memory element 2) in a modification of the embodiment described above. This memory element 2 is different from the memory element 1 in the respect that the ion source layer 21 is in the two-layer structure of an intermediate layer 21A and an ion supply layer 21B.

The ion source layer 21 is in the two-layer structure including the intermediate layer 21A and the ion supply layer 21B in order from the lower electrode 10 side. In other words, the ion supply layer 21B is disposed between the intermediate layer 21A and the upper electrode 30. The ion supply layer 21B is in the structure similar to that of the ion source layer 21 described above, i.e., contains one or more of transition metals in a group consisting of titanium, zirconium, hafnium, vanadium, niobium, tantalum, chromium, molybdenum, and tungsten together with one or two or more of metallic elements including copper, aluminum, germanium, zinc, and others and a chalcogen element. The intermediate layer 21A contains one or more of metallic elements in the ion supply layer 21B, i.e., copper, aluminum, germanium, zinc, and others, together with at least any one chalcogen element of tellurium, sulfur, and selenium. With the ion source layer 21 in the two-layer structure as such, in addition to the effect achieved in the embodiment above, the resulting nonvolatile memory is possibly with improved retention characteristics, and is operable at low current.

In the intermediate layer 21A, the ratio of the content of a metallic element such as copper, aluminum, germanium, and zinc to the content of a chalcogen element is preferably smaller than that in the ion supply layer 21B, i.e., the ratio of the content of a metallic element such as copper, aluminum, germanium, and zinc to the content of a chalcogen element. As to the metallic element in the intermediate layer 21A, i.e., copper, aluminum, germanium, zinc, and others, it is not added to the intermediate layer 21A at the time of manufacturing thereof, but is produced by diffusion as a result of the concentration gradient between the intermediate layer 21A and the ion supply layer 21B. Therefore, the metallic element in the intermediate layer 21A is supposed to be smaller in content than the stoichiometric composition of $Al_2Te_3$. Such a metallic element including copper, aluminum, germanium, zinc, and others is supposed to exist mostly in the form of ions. As such, by the effective use of the applied electric potential for driving of the ions, compared with the memory element 1, the resulting memory element 2 allows the nonvolatile memory operation at lower current with the better retention characteristics.

Moreover, when the ion source layer 21 contains aluminum, in response to the operation of writing, e.g., in response to application of a positive voltage to the memory element 2 such that the upper electrode 30 side is at a positive potential and the lower electrode 10 side is at a negative potential, aluminum ions move in the ion source layer 21, thereby forming aluminum almost in the form of metal in the vicinity of the interface between the lower electrode 10 and the ion source layer 21. When such a state is changed to data retention by stopping the writing voltage bias, the aluminum in the form of metal is oxidized easily, and the oxidized aluminum becomes high in resistance. This seems the cause of poor data retention in the low-resistance state.

However, considering that a chalcogen element is highly reactive to aluminum in the form of metal, if the content of a chalcogen element in the intermediate layer 21A on the lower electrode 10 side is increased more than that in the ion supply layer 21B, the aluminum in the form of metal reacts to the chalcogen element before oxidization. Accordingly, the characteristics of data retention are to be improved.

Also in the operation of erasing, e.g., application of a negative voltage to the memory element 2 such that the upper electrode 30 side is at a negative potential, and the lower electrode 10 side is at a positive potential, aluminum ions move easily in the intermediate layer 21A including a large content of chalcogen element. In other words, the supply of aluminum ions becomes easy by erasing bias, thereby improving the erasing characteristics. As such, the width of resistance separation is increased between the high- and low-resistance states.

With such a memory element 2 having the excellent characteristics of data retention, the resulting nonvolatile memory becomes operable at much lower current. In the below, a description thereabout is given.

When a nonvolatile memory cell is configured by a memory element together with a transistor, for increasing the capacity of the memory cell by the high-technology semiconductor process, both the memory element and the transistor are to be generally microfabricated. The more the transistor is microfabricated, the more the driving current is reduced. Therefore, for realizing a nonvolatile memory large in capacity but low in power consumption, the characteristics of data retention are expected to be improved in the state after the rewriting at low current. Moreover, for realizing the operation of rewriting at a high speed, keeping the resistance state is necessary after the rewriting at a high speed with short pulses of low current and nanosecond order by the microfabricated transistor.

The concern here is that, since keeping the resistance state by the lower rewriting energy as such is easily affected by thermal agitation, retention of data becomes more difficult with the lower current and at a higher speed. Herein, as is with the excellent characteristics of data retention, the memory element 2 is capable of retaining data after rewriting thereof at low current, i.e., allows the nonvolatile memory operation at low current.

Second Embodiment

Next, described is a memory element (memory element 3) in a second embodiment of the present disclosure. This memory element 3 is configured similarly to the memory element 1 in the first embodiment and the memory element 2 in the modification described above, i.e., includes a lower electrode 11 (first electrode), a memory layer 60, and the upper electrode 30 (second electrode) in this order (FIG. 1). In the memory element 3, the memory layer 60 is provided with a resistance change layer 62 on the lower electrode 11 side, and an ion source layer 61 on the upper electrode 30 side. The memory element 3 is different from the memory elements 1 and 2 in the respect that the lower electrode 11 contains fluorine or phosphorus (P).

Figure 1A:
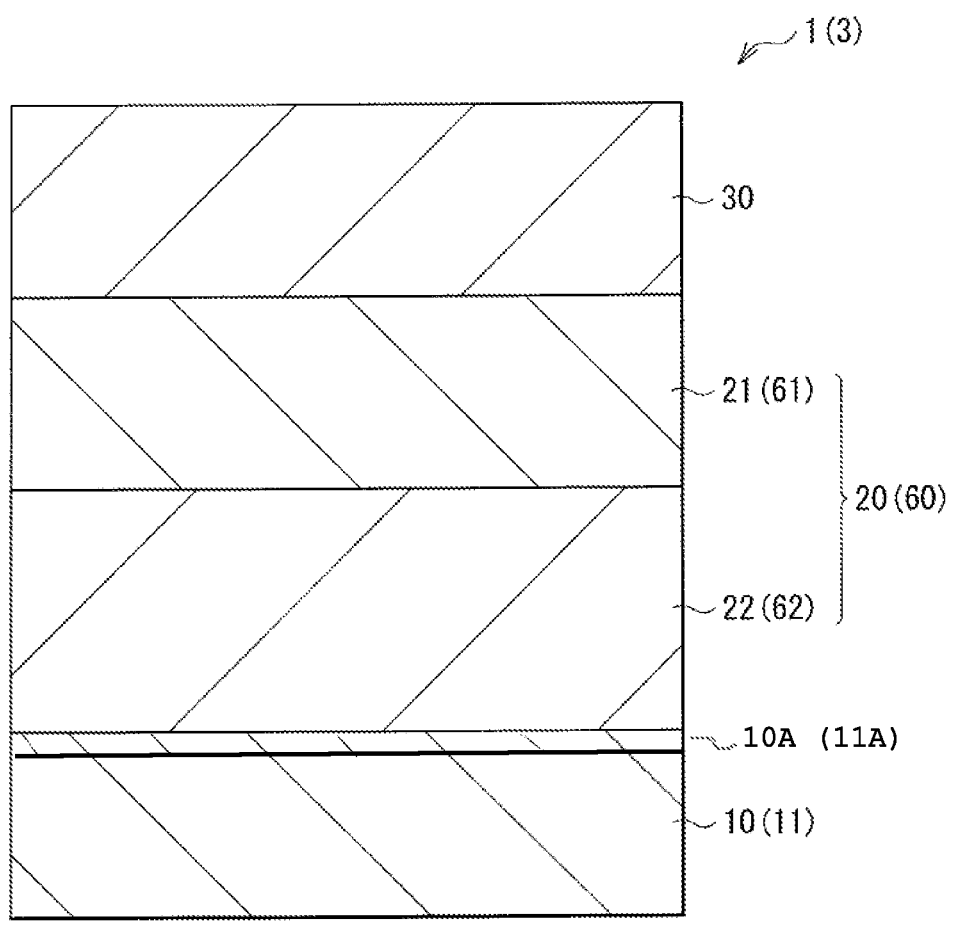
FIG. 1A is a cross-sectional view of a memory element with a fluoride oxide film or a phosphorous oxide film.

The lower electrode 11 contains 5% or more of fluorine or phosphorus at the time of formation of the lower electrode 11, for example. With the lower electrode 11 containing fluorine or phosphorus high in electronegativity as such, the resistance change layer 62 is protected from deterioration, and the dielectric strength thereof is increased. Either fluorine or phosphorus, the lower electrode 11 preferably contains fluorine whose electronegativity is higher. Moreover, after forming the lower electrode 11 by provision of fluorine or phosphorus thereto, oxidizing the resulting lower electrode 11 forms an fluoride oxide film or a phosphorus oxide film 10A (11A) on the surface of the lower electrode 11, i.e., on the surface between the lower electrode 11 and the resistance change layer 62 being in contact with the lower electrode 11. See FIG. 1A. With such a fluoride oxide film or a phosphorus oxide film, the dielectric strength is increased all the more. This fluoride oxide film or phosphorus oxide film contains a larger number of elements than any other oxide film not containing fluorine or phosphorus, and thus is more solid and more stable with the complementary bonding.

The resistance change layer 62 is made of a compound mainly containing Te, which behaves as an anionic component, for example. The compound as such includes AlTe, MgTe, ZnTe, and others. This resistance change layer 62 may contain fluorine or phosphorus, or like the memory elements 1 and 2 described above, the resistance change layer 62 may be made of fluoride. The material of the resistance change layer 62 is not restricted to the compound mainly containing Te as such, and may be also any oxide such as GaOx and AlOx.

The ion source layer 61 may be in the single-layer structure (FIG. 1) or, as described in the modification above, may be in the layered structure (FIG. 2) of an intermediate layer 61A and an ion supply layer 61B.

The memory element 3 in this embodiment is manufactured as below, for example.

Figure 18:
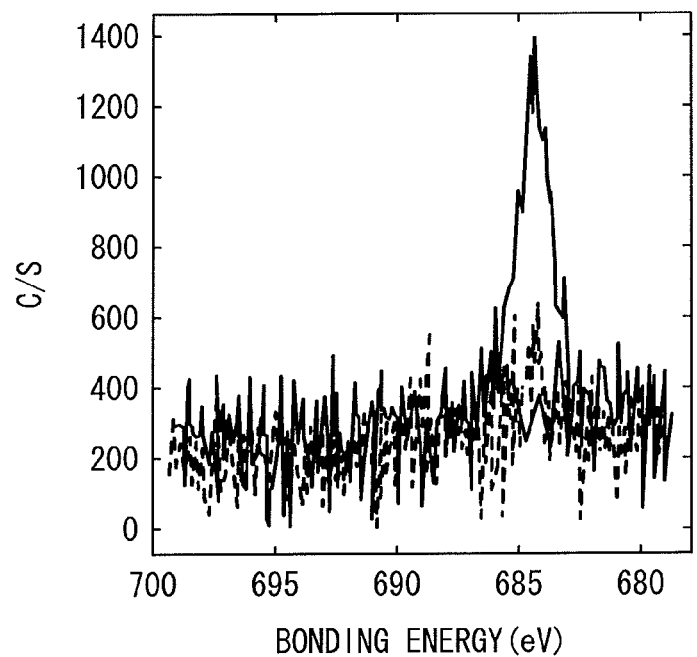
FIG. 18 is an XPS spectrum diagram showing the provision of fluorine in a first electrode.
Figure 19:
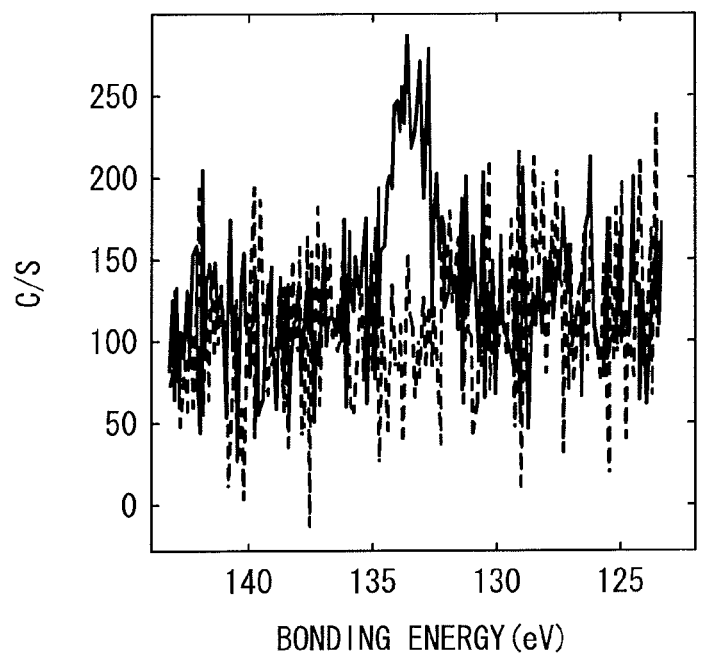
FIG. 19 is an XPS spectrum diagram showing the provision of phosphorus in the first electrode.

First of all, an operation of etching is performed to titanium nitride using gas containing $SF_6$, for example. As a result, the titanium nitride is plasma fluorinated, thereby being able to form the lower electrode 11 containing fluorine. This operation is confirmed to provide fluorine to the lower electrode 11 without fail by the XPS (X-ray Photoelectron Spectroscopy) measurement. FIG. 18 shows the resulting XPS spectrum. In the drawing, the solid lines indicate the spectrum of the plasma-fluorinated lower electrode 11, and the broken lines indicates the spectrum of the not-plasma fluorinated lower electrode. As an alternative to the plasma fluorinate treatment, the titanium nitride may be cleansed using a chemical solution containing phosphorus. This produces the lower electrode 11 containing phosphorus. As shown in FIG. 19, this lower electrode 11 is similarly confirmed to contain phosphorus.

Next, the surface of the lower electrode 11 is exposed to the oxygen atmosphere at the room temperature. This accordingly forms a fluoride oxide film or a phosphorus oxide film 10A (11A) on the surface of the lower electrode 11. See FIG. 1A. For oxidation of the lower electrode 11, other than placing the sample into the oxygen atmosphere, any aggressive oxidation treatment such as plasma oxidation may be performed. Alternatively, a fluoride oxide film or a phosphorus oxide film 10A (11A) may be formed on the electrode 11 by any other process.

After the oxidization treatment to the surface of the lower electrode 11, the layers are formed similarly to the first embodiment described above, i.e., the resistance change layer 62, the ion source layer 61, and the upper electrode 30. Lastly, the resulting structure is subjected to a heat treatment at 320° C. for two hours, for example, so that the memory element 3 is manufactured.

Memory Device

By arranging a large number of memory elements 1, 2, or 3 described above in rows or in a matrix, for example, a memory device (memory) is possibly configured. At this time, as appropriate, the memory elements 1, 2, and 3 may be each connected with a MOS (Metal Oxide Semiconductor) transistor for element selection use or with a diode to configure a memory cell. The resulting memory cells may be then each connected to a sense amplifier, an address decoder, circuits of writing, erasing, and reading, and others by wiring.

Figure 3:
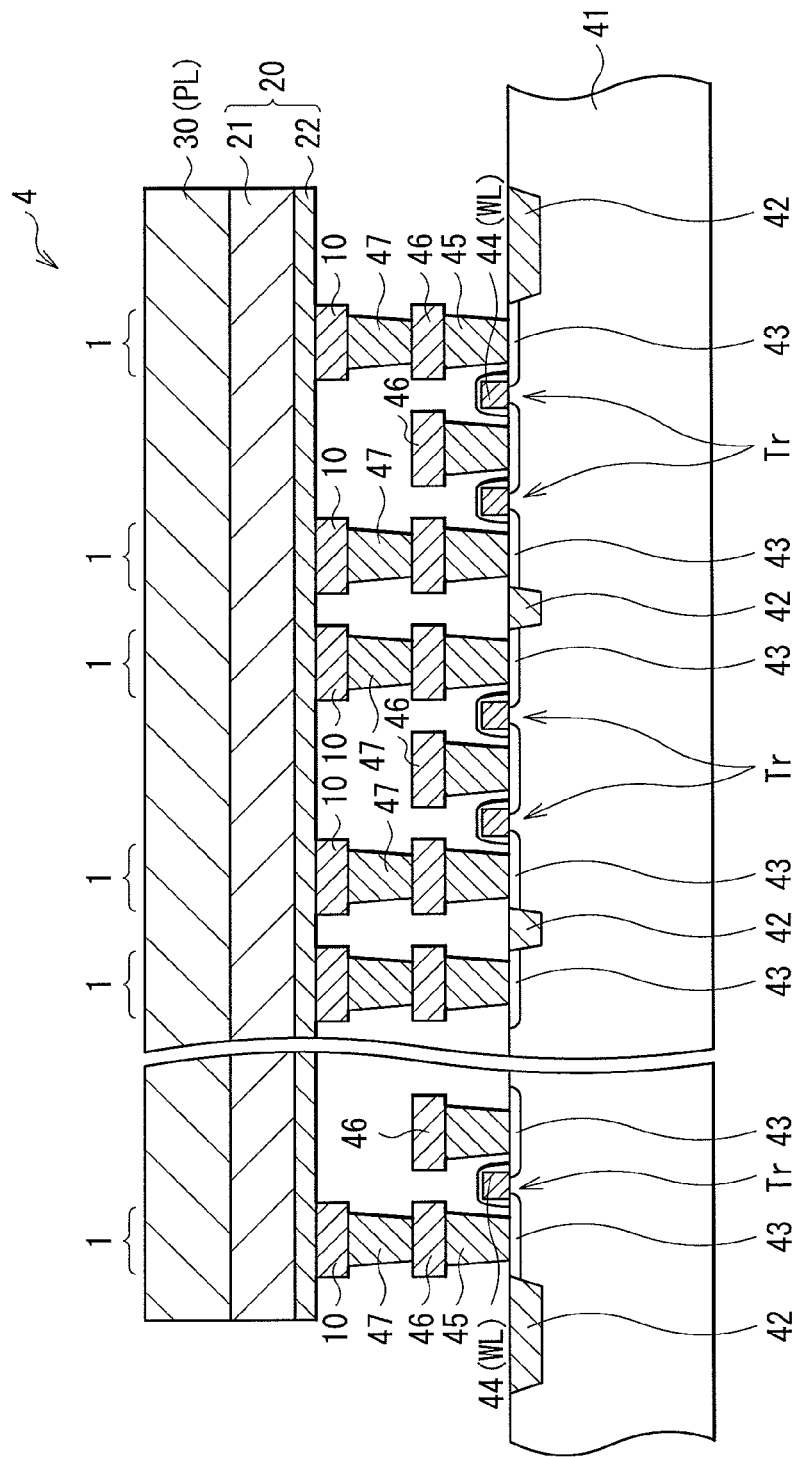
FIG. 3 is a cross-sectional view of a memory cell array using the memory element of FIG. 1, showing the configuration thereof.
Figure 4:
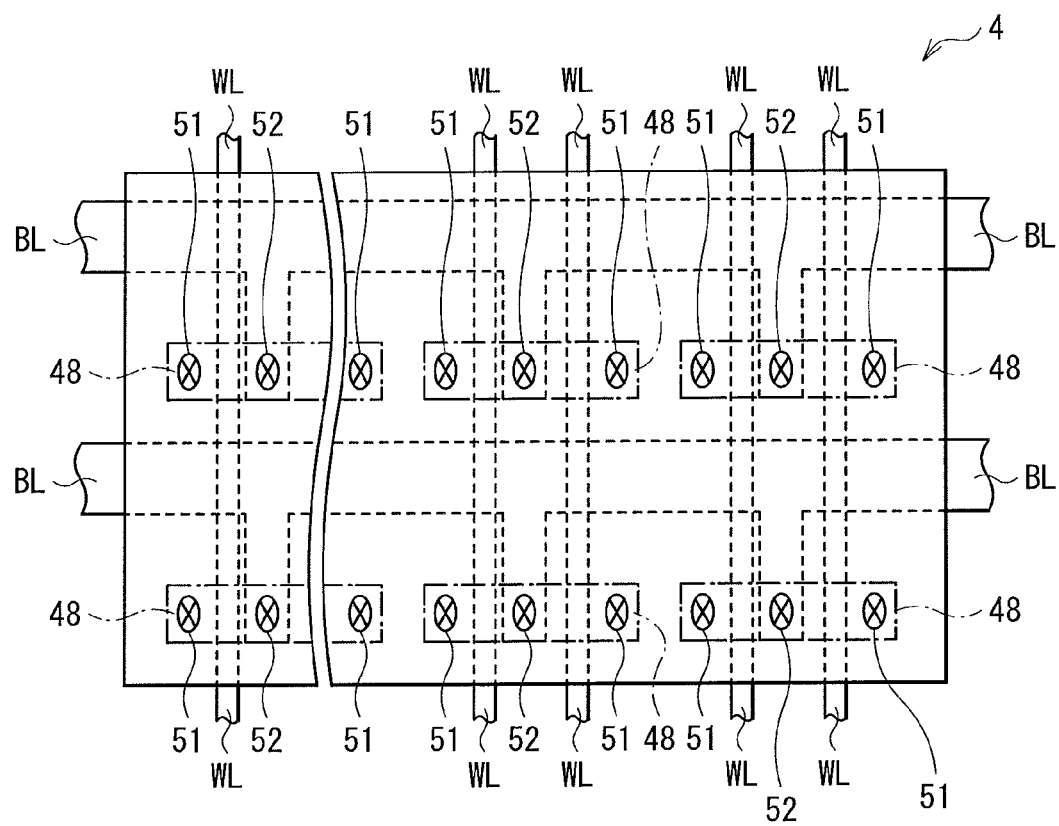
FIG. 4 is a plan view of the memory cell array of FIG. 3.
Figure 5A:
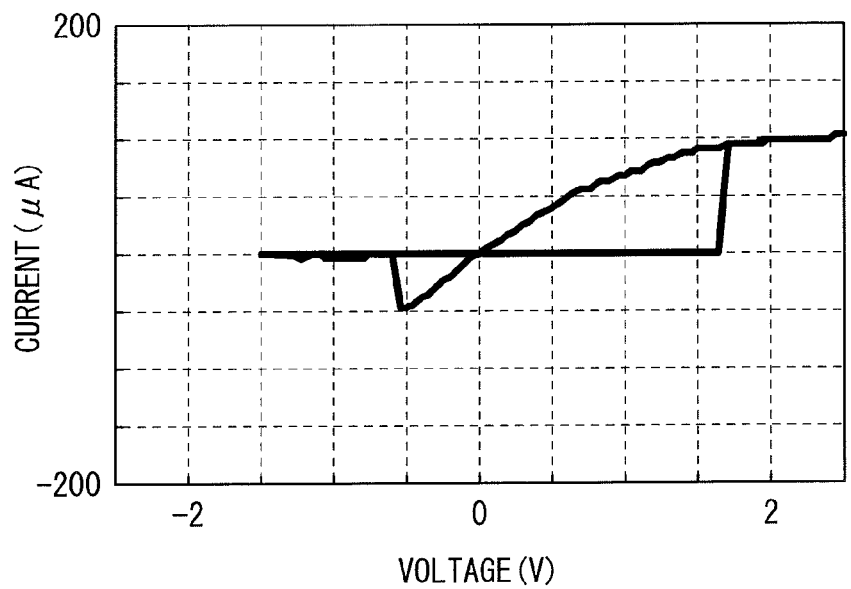
FIGS. 5A and 5B are each a characteristics diagram showing an exemplary current-voltage relationship in a memory element of Example. 1.
Figure 5B:
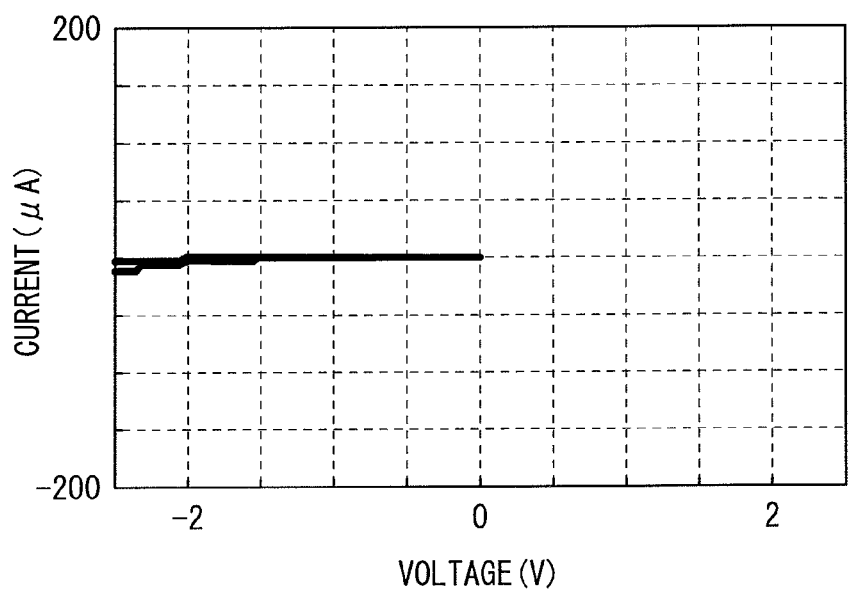
Figure 6A:
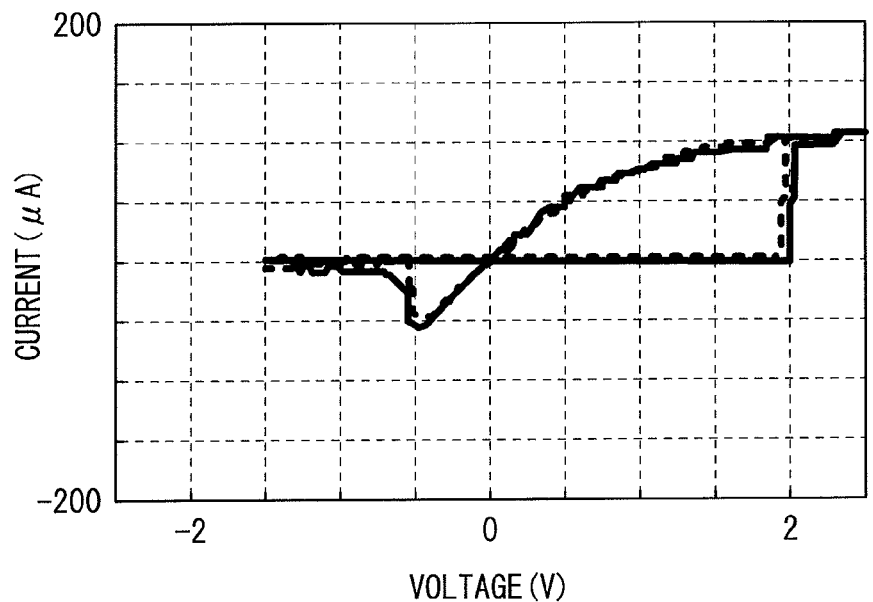
FIGS. 6A and 6B are each a characteristics diagram showing an exemplary current-voltage relationship in a memory element of Example. 2.
Figure 6B:
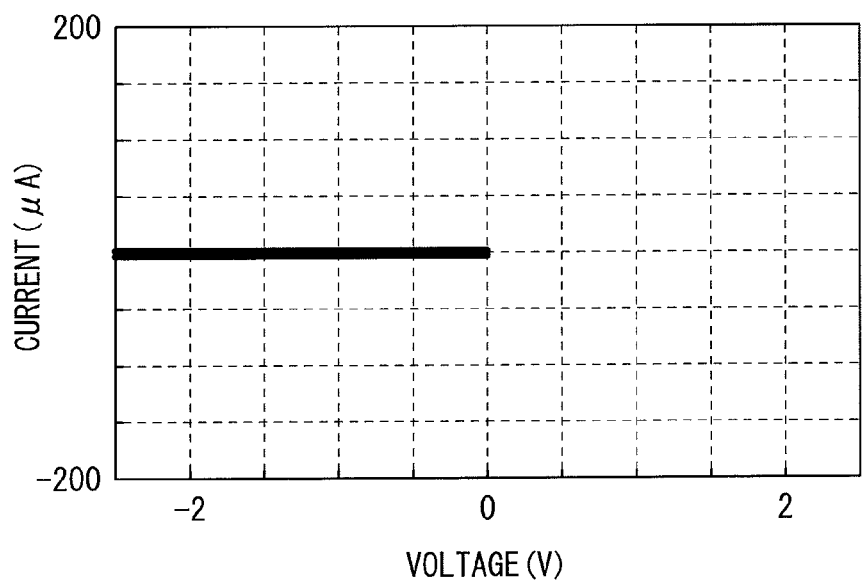
Figure 7A:
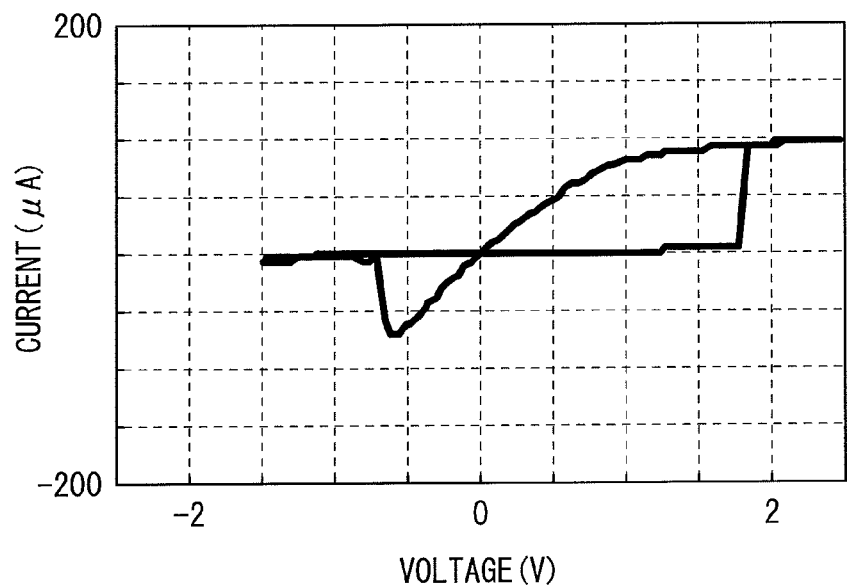
FIGS. 7A and 7B are each a characteristics diagram showing an exemplary current-voltage relationship in a memory element of Example. 3.
Figure 7B:
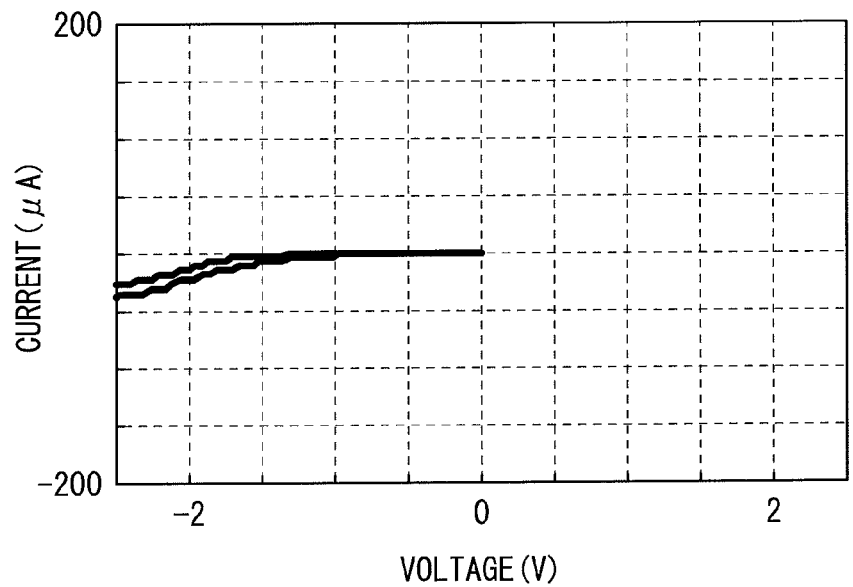
Figure 8A:
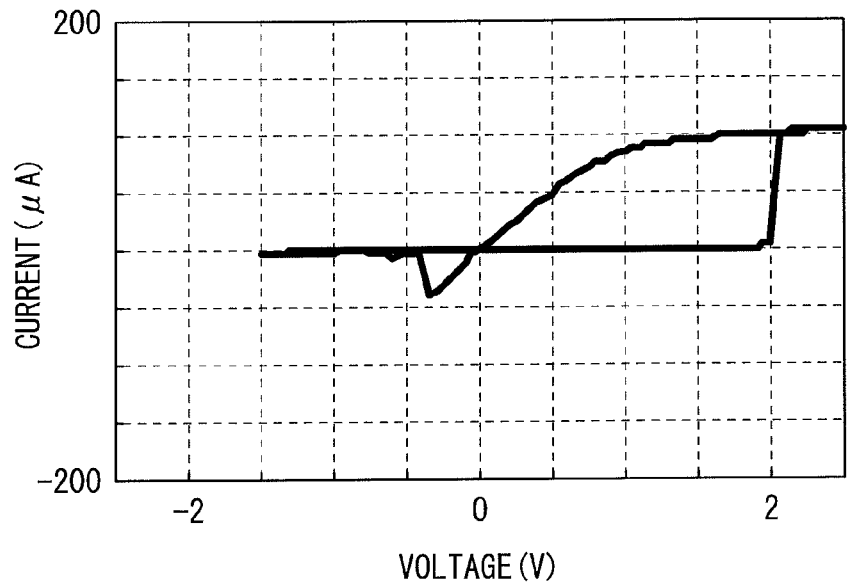
FIGS. 8A and 8B are each a characteristics diagram showing an exemplary current-voltage relationship in a memory element of Example. 4.
Figure 8B:
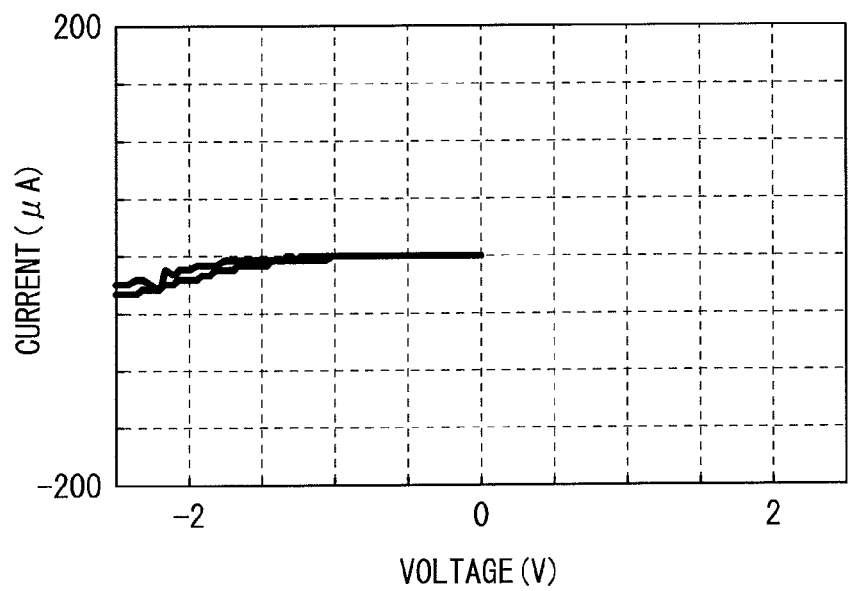

FIGS. 3 and 4 each show an exemplary memory device (memory cell array 4) including a large number of memory elements 1, 2, or 3 arranged in a matrix. FIG. 3 shows the cross-sectional configuration of the memory cell array 4, and FIG. 4 shows the configuration thereof in a planar view. In this memory cell array 4, to each of the memory elements 1, 2, or 3, wiring for connection to the side of the lower electrode 10 or 11 thereof is so provided as to intersect wiring for connection to the upper electrode 30 side thereof, and at the respective intersection points, the memory element 1, 2, or 3 is disposed, for example.

The memory elements 1, 2, or 3 all share the layers, i.e., the resistance change layer 22 or 62, the ion source layer 21 or 61, and the upper electrode 30. In other words, these layers, i.e., the resistance change layer 22 or 62, the ion source layer 21 or 61, and the upper electrode 30, are each for the shared use by all of the memory elements 1, 2, or 3 (are each one specific layer for use by all of the memory elements 1, 2, or 3). The upper electrode 30 is a plate electrode PL for shared use by any adjacent cells.

On the other hand, the lower electrode 10 or 11 is provided individually to each of the memory cells so that the memory cells are electrically separated from one another. As such, the memory elements 1, 2, or 3 in the memory cells are each defined by position to correspond to its lower electrode 10 or 11. The lower electrode 10 or 11 is connected to its corresponding MOS transistor Tr for cell selection use, and the memory elements 1, 2, or 3 are each disposed above its corresponding MOS transistor Tr.

The MOS transistor Tr is configured by source/drain regions 43, and a gate electrode 44, which are formed in a region separated by an element separation layer 42 in the substrate 41. A sidewall insulation layer is formed on the wall surface of the gate electrode 44. The gate electrode 44 serves also as a word line WL, which is one of two pieces of address wiring for the memory element 1 or 2. One of the source/drain regions 43 of the MOS transistor Tr is electrically connected to the lower electrode 10 or 11 of the memory element 1, 2, or 3 via various layers, i.e., a plug layer 45, a metal wiring layer 46, and a plug layer 47. The other of the source/drain regions 43 of the MOS transistor Tr is connected to the metal wiring layer 46 via the plug layer 45. The metal wiring layer 46 is connected to a bit line BL (refer to FIG. 4), which is the remaining piece of address wiring for the memory element 1, 2, or 3. Note that, in FIG. 4, an active region 48 of the MOS transistor Tr is indicated by alternate long and short dashed lines. In the active region 48, contact sections 51 are connected to the lower electrode 10 or 11 of the memory element 1, 2, or 3, and a contact section 52 is connected to the bit line BL.

In such a memory cell array 4, when a voltage is applied to the bit lines BL with the gate electrode 44 of the MOS transistor Tr turned ON by the word line WL, the voltage is directed to the lower electrode 10 or 11 of the selected memory cell via the source/drain regions 43 of the MOS transistor Tr. In this example, as for the voltage applied to the lower electrode 10 or 11, when the polarity thereof is at a negative potential compared with the potential of the upper electrode 30 (the plate electrode PL), the resistance value of the memory element 1, 2, or 3 is changed in state to low resistance, whereby the selected memory cell is written with information. Next, when the potential of the voltage applied this time to the lower electrode 10 or 11 is positive compared with the potential of the upper electrode 30 (the plate electrode PL), the memory element 1, 2, or 3 is changed in resistance state again to high, whereby the information written to the selected memory cell is erased. For reading of the written information, for example, a selection of memory cell is made by the MOS transistor Tr, and with respect to the selected memory cell, a predetermined level of voltage or current is applied. The current or voltage for application to the memory element 1, 2, or 3 varies in level based on the resistance state of the memory element 1, 2, or 3 at this time, and such varying values are detected via a sense amplifier or others connected to the tip of the bit line BL or of the plate electrode PL. Herein, the voltage or current for application to the selected memory cell is set to be smaller than the threshold value of the voltage or others at which the memory element 1, 2, or 3 shows a change of resistance state.

The memory elements 1, 2, and 3 of the first and second embodiments and the modification are applicable to various types of memory devices. For example, the memory element applicable for use includes any types of memories such as once-writable PROM (Programmable Read Only Memory), electrically erasable EEPROM (Erasable and Programmable Read Only Memory), or so-called RAM available for high-speed writing, erasing, and reproduction.

EXAMPLES

In the below, specific examples of the present technology are described by referring to Comparative Examples.

Example 1

First of all, the memory element 1 of FIG. 1 was manufactured similarly to the memory element of the first embodiment described above. First of all, the lower electrode 10 made of titanium nitride was formed with the size equal to 150 nmφ. Thereafter, the layers were stacked by sputtering, i.e., the resistance change layer 22 made of magnesium fluoride with the thickness of 2 nm, the ion source layer 21 made of CuZrTeAl (Cu 11%-Zr 12%-Te 30%-Al 47%) with the thickness of 45 nm, and the upper electrode 30 made of zirconium with the thickness of 20 nm. The magnesium fluoride was deposited by RF (Radio Frequency) magnetron sputtering. Lastly, the resulting structure was processed by photolithography, thereby manufacturing the memory element 1. The composition and thickness of the films in Example 1 were schematically as below.

TiN/MgF$_2$ (2 nm)/CuZrTeAl (45 nm)/Zr (20 nm)

Example 2

The ion source layer 21 was formed in the two-layered structure including the intermediate layer 21A and the ion supply layer 21B. The intermediate layer 21A was made of tellurium with the thickness of 3 nm, and the ion supply layer 21B was formed by CuZrTeAl (Cu 11%-Zr 12%-Te 30%-Al 47%) with the thickness of 45 nm. Excepting this, the memory element 2 of FIG. 2 was manufactured similarly to the memory element of Example 1. The composition and thickness of the films in Example 2 were schematically as below.

TiN/MgF$_2$ (2 nm)/Te (3 nm)/CuZrTeAl (45 nm)/Zr (20 nm)

Example 3

The resistance change layer 22 was formed by aluminum fluoride with the thickness of 0.5 nm, and the ion source layer 21 was formed by the intermediate layer 21A and the ion supply layer 21B. The intermediate layer 21A was made of tellurium with the thickness of 5 nm, and the ion supply layer 21B was formed by CuZrTeAl (Cu 13%-Zr 13%-Te 33%-Al 41%) with the thickness of 50 nm. The aluminum fluoride was deposited by RF magnetron sputtering. Excepting this, the memory element 2 of FIG. 2 was manufactured similarly to the memory element of Example 1. The composition and thickness of the films in Example 3 were schematically as below.

TiN/AlF$_3$ (0.5 nm)/Te (5 nm)/CuZrTeAl (50 nm)/Zr (55 nm)

Example 4

The resistance change layer 22 was formed by aluminum fluoride with the thickness of 1 nm, and the ion source layer 21 was formed by the intermediate layer 21A and the ion supply layer 21B. The intermediate layer 21A was made of tellurium with the thickness of 5 nm, and the ion supply layer 21B was formed by CuZrTeAl (Cu 13%-Zr 13%-Te 33%-Al 41%) with the thickness of 50 nm. In other words, these layers were stacked together similarly to those in Example 3 with only a difference of the thickness of the resistance change layer 22. Excepting this, the memory element 2 of FIG. 2 was manufactured similarly to the memory element of Example 1. The composition and thickness of the films in Example 4 were schematically as below.

TiN/AlF$_3$ (1 nm)/Te (5 nm)/CuZrTeAl (50 nm)/Zr (55 nm)

Example 5

After forming a film of aluminum fluoride with the thickness of 0.5 nm, the resulting aluminum fluoride film was subjected to plasma oxidation so that the resistance change layer 22 was formed. Thereafter, the ion source layer 21 was formed by the intermediate layer 21A and the ion supply layer 21B. The intermediate layer 21A was made of tellurium with the thickness of 5 nm, and the ion supply layer 21B was made of CuZrTeAl (Cu 13%-Zr 13%-Te 33%-Al 41%) with the thickness of 50 nm. In other words, the layers were configured similarly to those in Example 3 with a difference that the resistance change layer 22 was subjected to plasma oxidation. Excepting this, the memory element 2 of FIG. 2 was manufactured similarly to the memory element of Example 1. The composition and thickness of the films in Example 5 were schematically as below.

TiN/AlF$_3$ (0.5 nm)/Plasma Oxidation/Te (5 nm)/CuZrTeAl (50 nm)/Zr (55 nm)

Comparative Example 1

As Comparative Example 1, first of all, a lower electrode made of titanium nitride was formed with the size equal to 150 nmφ. Thereafter, layers were stacked by sputtering, i.e., a film of gadolinium oxide (GdO$_X$) (resistance change layer) with the thickness of 2 nm, a CuZrTeAlGe (Cu 11%-Zr 11%-Te 29%-Al 42%-Ge 7%) (ion source layer) with the thickness of 45 nm, and an upper electrode made of tungsten with the thickness of 50 nm. Lastly, the resulting structure was processed by photolithography, thereby manufacturing a memory element of Comparative Example 1. The composition and thickness of the films in Comparative Example 1 were schematically as below.

TiN/GdO$_X$ (2 nm)/CuZrTeAlGe (45 nm)/W (50 nm)

Comparative Example 2

As Comparative Example 2, first of all, a lower electrode made of titanium nitride was formed with the size equal to 150 nmφ, and then the resulting lower electrode was subjected to plasma oxidation. Thereafter, layers were stacked by sputtering, i.e., a film made of aluminum telluride (AlTe) (Al 10%-Te 90%) with the thickness of 2 nm, a film made of CuZrTeAlGe (Cu 13%-Zr 13%-Te 31%-Al 37%-Ge 6%) (ion source layer) with the thickness of 60 nm, and an upper electrode made of tungsten with the thickness of 50 nm. Lastly, the resulting structure was processed by photolithography, thereby manufacturing a memory element of Comparative Example 2. The composition and thickness of the films in Comparative Example 2 were schematically as below.

TiN/Plasma Oxidation/AlTe (2 nm)/CuZrTeAlGe (45 nm)/W (50 nm)

Note that the composition of each layer in Comparative Example 2 above was the one at the time of manufacturing, and in actuality, was assumed as below due to plasma oxidation and a heat treatment (320° C. annealing) in the manufacturing process. That is, the aluminum oxide film (AlO$_X$) corresponded to the resistance change layer.

TiN/TiON/AlO$_X$/AlTe/CuZrTeAlGe (45 nm)/W (50 nm)

Figure 9A:
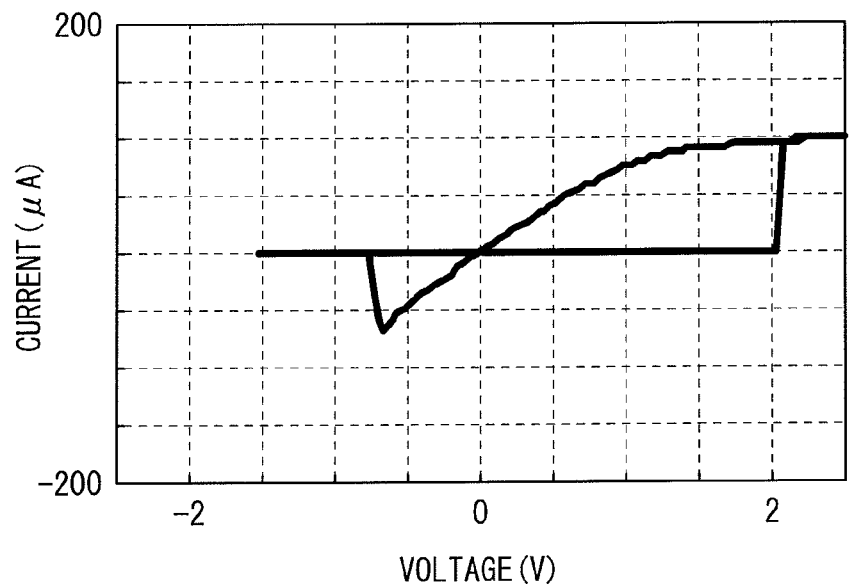
FIGS. 9A and 9B are each a characteristics diagram showing an exemplary current-voltage relationship in a memory element of Example. 5.
Figure 9B:
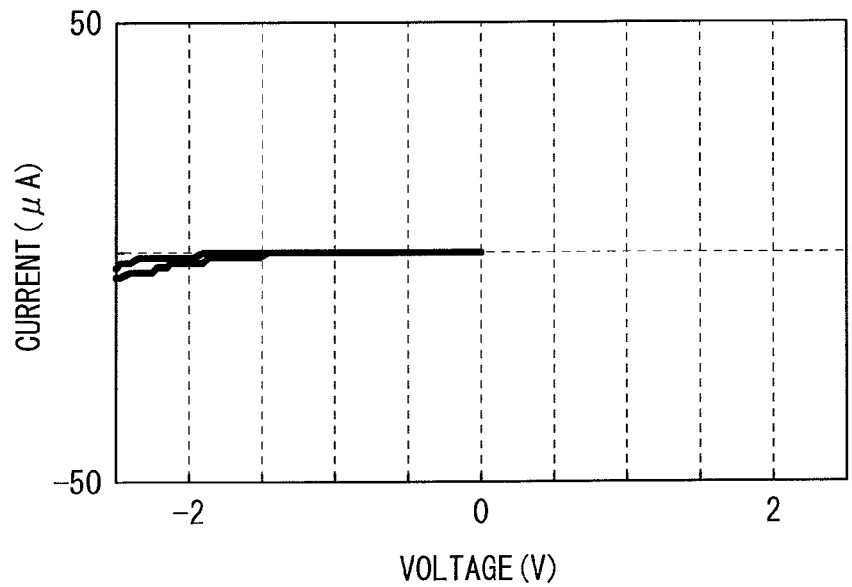
Figure 10A:
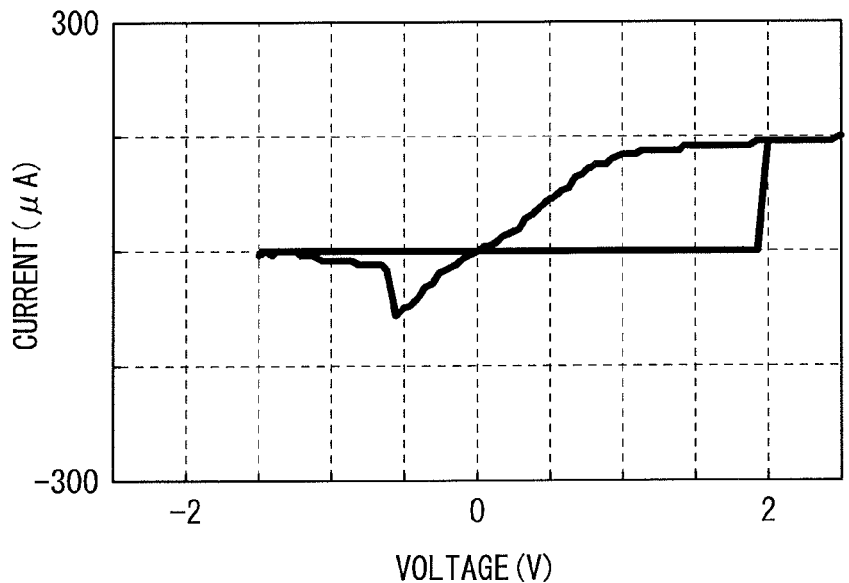
FIGS. 10A and 10B are each a characteristics diagram showing an exemplary current-voltage relationship in a memory element of Comparative Example 1.
Figure 10B:
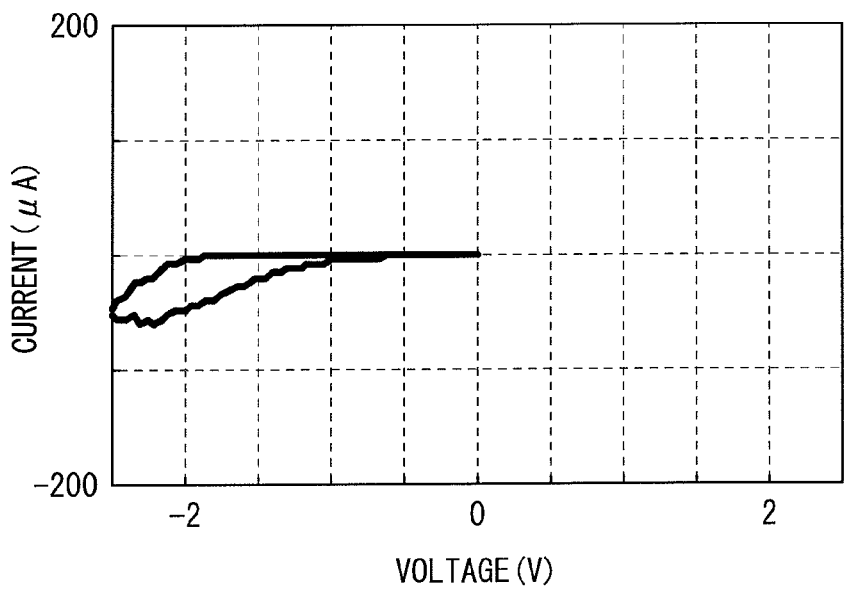
Figure 11A:
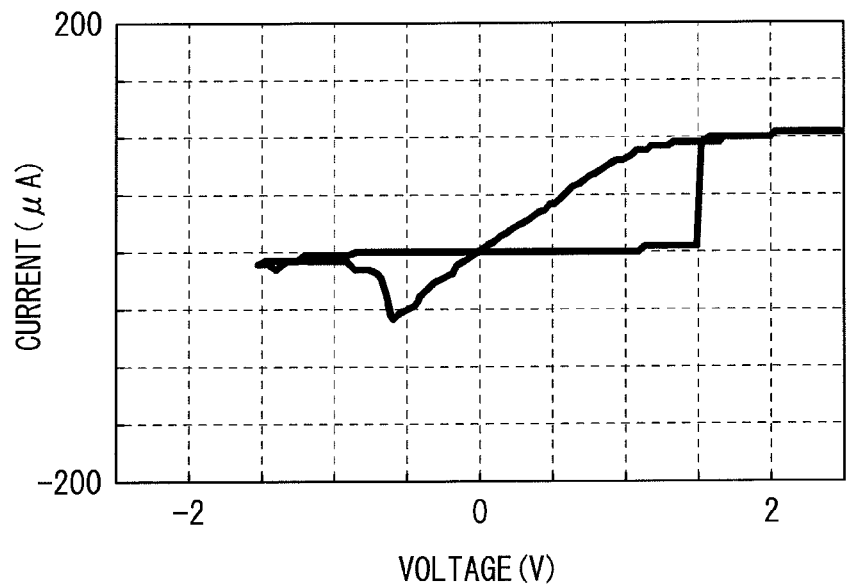
FIGS. 11A and 11B are each a characteristics diagram showing an exemplary current-voltage relationship in a memory element of Comparative Example 2.
Figure 11B:
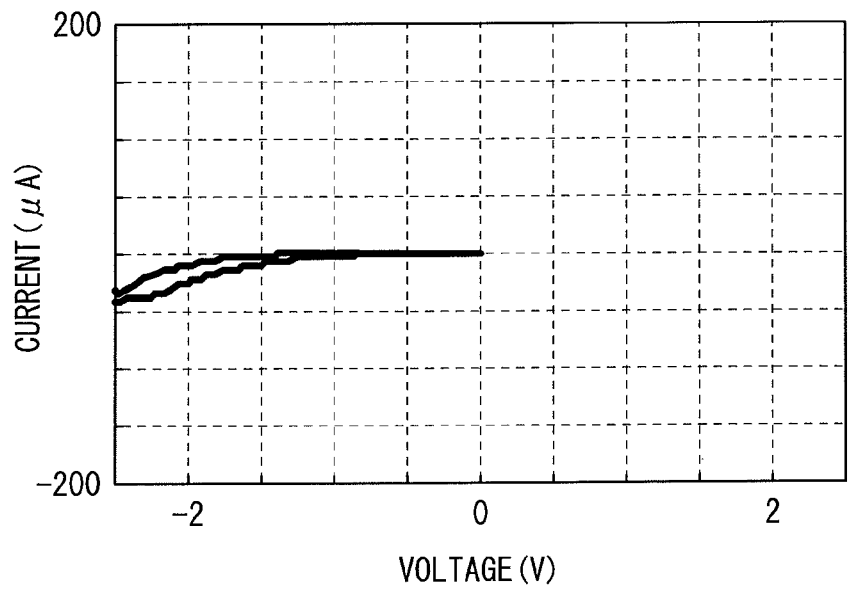
Figure 12A:
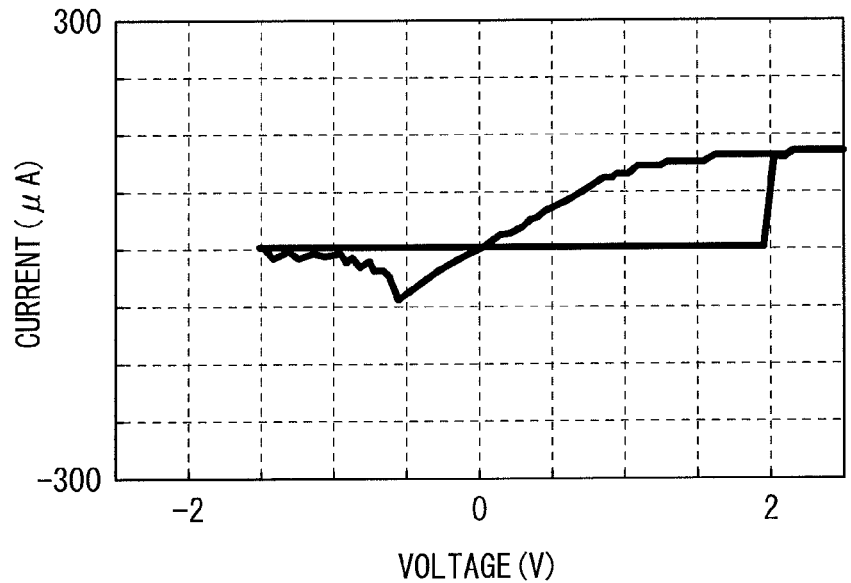
FIGS. 12A and 12B are each a characteristics diagram showing an exemplary current-voltage relationship in a memory element of Example 6.
Figure 12B:
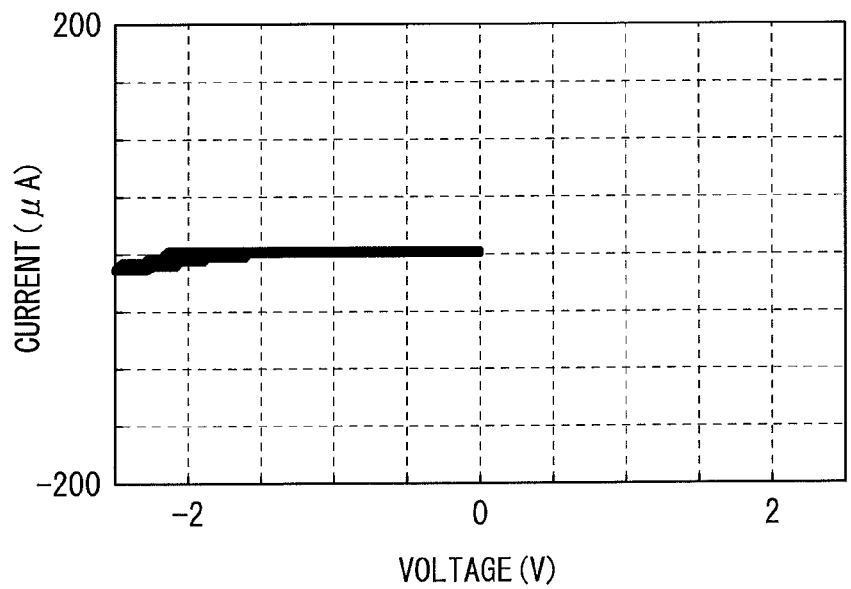
Figure 13A:
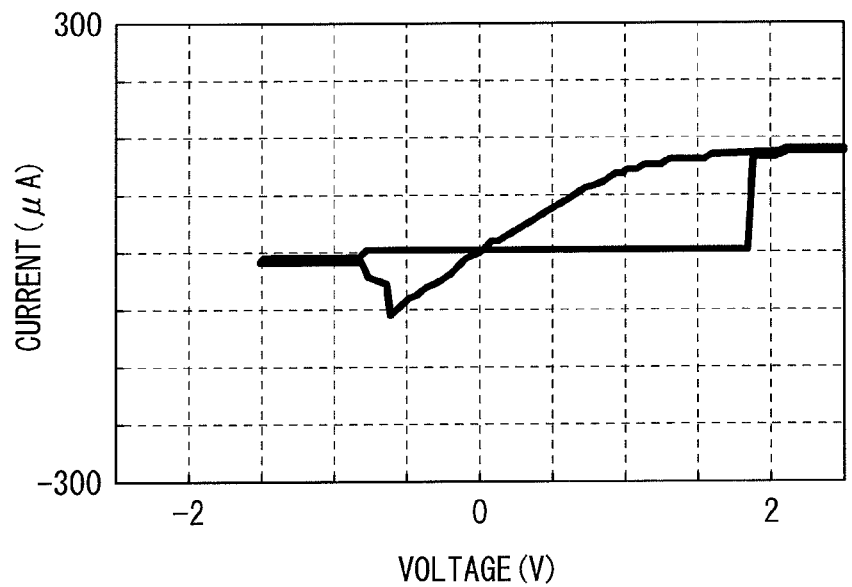
FIGS. 13A and 13B are each a characteristics diagram showing an exemplary current-voltage relationship in a memory element of Example 7.
Figure 13B:
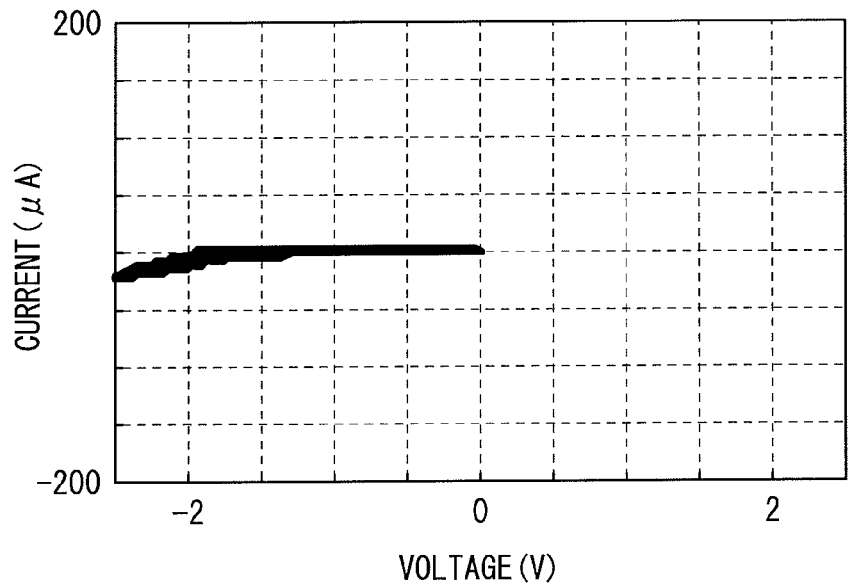
Figure 15A:
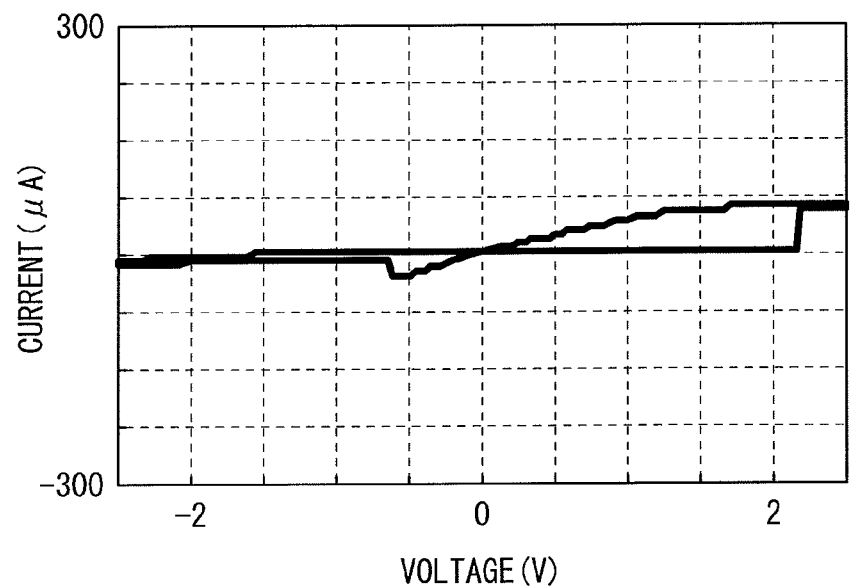
FIGS. 15A and 15B are each a characteristics diagram showing an exemplary current-voltage relationship in a memory element of Example 9.
Figure 15B:
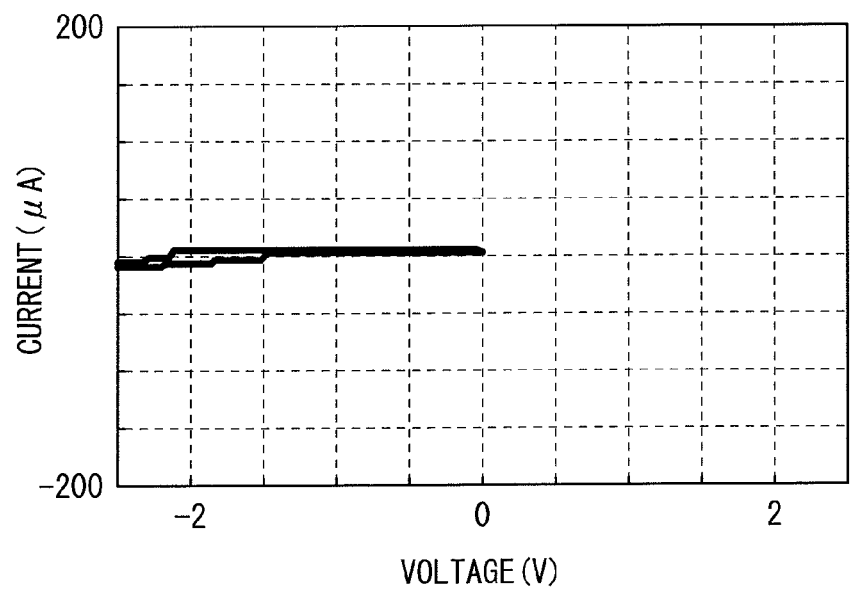

With the driving of a transistor (W (Channel Width)/L (Channel Length)=0.7/0.34 μm) to the memory elements of Examples 1 to 5, and to those of Comparative Examples 1 and 2 manufactured as above, a voltage was applied thereto for measuring any change of current value. FIGS. 5A and 5B to FIGS. 11A and 11B each show a characteristics diagram showing the current-voltage relationship in Examples 1 to 5, and that in Comparative Examples 1 and 2 at this time. FIGS. 5A to 11A each show a case with successive application of a voltage like 0→2.5→−1.5 V. FIGS. 5B to 11B each show a case with application of a voltage like 0→−3→0 V. Note that only the vertical axis in FIG. 9B is with a different scale.

In the case with the successive application of a voltage like 0→2.5→1.5 V, in all of Examples 1 to 5 and Comparative Examples 1 and 2, with the application of a positive voltage, the initial state of high resistance was changed to low-resistance state, and when the voltage for application was changed to negative, the state was changed again to the high-resistance state. In other words, this showed the memory switching characteristics (FIGS. 5A to 11A). On the other hand, in the case with the successive application of a voltage like 0→−3→0 V, although the high-resistance state is supposed to remain as it is, FIGS. 10B and 11B each show an increase of current value at the same level of applied voltage. In other words, Comparative Examples 1 and 2 both caused a reduction of current value, and degradation of the memory characteristics was observed due to deterioration of the gadolinium oxide layer in Comparative Example 1, and of the aluminum oxide layer in Comparative Example 2.

On the other hand, FIGS. 5B to 9B in Examples 1 to 5 show no increase of current value, and the high-resistance state is remained as it is. Accordingly, providing fluoride to the resistance change layer 22 was confirmed to protect the memory characteristics from degradation to be caused by deterioration of the resistance change layer 22. Such effect was not dependent on the structure of the ion source layer 21, i.e., whether it was in a single-layer structure (Example 1) or in the layered structure (Example 2), and were not also dependent on the thickness of the resistance change layer 22 (Examples 3 and 4). However, the effect as such was confirmed to be especially high when the resistance change layer 22 in use was oxidized (Example 5). Note that, in Example 5, exemplified was the case where the ion source layer 21 was configured by the intermediate layer 21A and the ion supply layer 21B. Alternatively, the similar effect was to be achieved when the ion source layer 21 was a single layer.

Example 6

Next, the memory element 3 was manufactured similarly to the memory element of the second embodiment described above. First of all, an operation of etching was performed to titanium nitride of the size equal to 150 nmφ using gas containing SF$_6$, thereby forming the lower electrode 11 containing fluorine. Next, the resulting lower electrode 11 was subjected to a heat treatment, and the surface thereof was oxidized by exposing the lower electrode 11 to the oxygen atmosphere. Thereafter, layers were stacked by sputtering, i.e., the resistance change layer 62 made of AlTe (Al 20%-Te 80%) with the thickness of 4 nm, the intermediate layer 61A made of CuZrTeAl (Cu 12.9%-Zr 12.9%-Te 41.6%-Al 32.6%) with the thickness of 8.16 nm, the ion supply layer 61B made of CuZrTeAlGe (Cu 12.5%-Zr 12.5%-Te 36%-Al 32%-Ge 7%) with the thickness of 51.9 nm, and the upper electrode 30 made of tungsten with the thickness of 30 nm. Lastly, the resulting structure was subjected to a heat treatment at 320° C. for two hours, thereby manufacturing the memory element 3. The composition and thickness of the films in Example 6 were schematically as below.

[TiN]—F/"Oxygen Atmosphere"/AlTe (4 nm)/CuZrTeAl (8.16 nm)/CuZrTeAlGe (51.9 nm)/W (30 nm)

Example 7

The resistance change layer 62 was formed by AlTe (Al 40%-Te 60%) with the thickness of 3.5 nm. Excepting this, the memory element 3 was manufactured similarly to the memory element of Example 6. The composition and thickness of the films in Example 7 were schematically as below.

[TiN]—F/"Oxygen Atmosphere"/AlTe (3.5 nm)/CuZrTeAl (8.16 nm)/CuZrTeAlGe (51.9 nm)/W (30 nm)

Example 8

The resistance change layer 62 was formed by AlTe (Al 20%-Te 80%) with the thickness of 3.5 nm. Excepting this, the memory element 3 was manufactured similarly to the memory element of Example 6. The composition and thickness of the films in Example 8 were schematically as below.

[TiN]—F/"Oxygen Atmosphere"/AlTe (3.5 nm)/CuZrTeAl (8.16 nm)/CuZrTeAlGe (51.9 nm)/W (30 nm)

Example 9

The lower electrode 11 was formed by cleansing titanium nitride using a chemical solution containing phosphorus (AF300; manufactured by Wako Pure Chemical Industries, Ltd.). The resistance change layer 62 was formed by AlTe (Al 40%-Te 60%) with the thickness of 4 nm. Excepting this, the memory element 3 was manufactured similarly to the memory element of Example 6. The composition and thickness of the films in Example 9 were schematically as below.

[TiN]—P/"Oxygen Atmosphere"/AlTe (4 nm)/CuZrTeAl (8.16 nm)/CuZrTeAlGe (51.9 nm)/W (30 nm)

Comparative Example 3

As Comparative Examples (Comparative Examples 3 and 4) against Examples 6 to 9, a lower electrode containing no fluorine or phosphorus but titanium nitride was formed with the size equal to 150 nmφ. The resulting lower electrode was then subjected to plasma oxidation. Thereafter, layers were stacked by sputtering, i.e., a film made of AlTe (Al 20%-Te 80%) (resistance change layer) with the thickness of 4 nm, a film made of CuZrTeAl (Cu 12.9%-Zr 12.9%-Te 41.6%-Al 32.6%) (intermediate layer) with the thickness of 8.16 nm, a film made of CuZrTeAlGe (Cu 12.5%-Zr 12.5%-Te 36%-Al 32%-Ge 7%) (ion supply layer) with the thickness of 51.9 nm, and an upper electrode made of tungsten with the thickness of 30 nm. Lastly, the resulting structure was processed by photolithography, thereby manufacturing a memory element of Comparative Example 3. The composition and thickness of the films in Comparative Example 3 were schematically as below.

TiN/Plasma Oxidation/AlTe (4 nm)/CuZrTeAl (8.16 nm)/CuZrTeAlGe (51.9 nm)/W (30 nm)

Comparative Example 4

In Comparative Example 4, for use as a resistance change layer, a film of AlTe (Al 20%-Te 80%) was formed with the thickness of 3.5 nm. Excepting this, a memory element was manufactured similarly to the memory element of Comparative Example 3. The composition and thickness of the films in Comparative Example 4 were schematically as below.

TiN/Plasma Oxidation/AlTe (3.5 nm)/CuZrTeAl (8.16 nm)/CuZrTeAlGe (51.9 nm)/W (30 nm)

With the driving of a transistor (W (Channel Width)/L (Channel Length)=0.7/0.34 μm) to the memory elements of Examples 6 to 9, and to those of Comparative Examples 3 and 4 manufactured as above, a voltage was applied thereto for measuring any change of current value. FIGS. 12A and 12B to FIGS. 17A and 17B each show a characteristics diagram showing the current-voltage relationship in Examples 6 to 9, and that in Comparative Examples 3 and 4 at this time. FIGS. 12A to 17A each show a case with successive application of a voltage like 0→2.5→−1.5 V. FIGS. 12B to 17B each show a case with application of a voltage like 0→−3 0 V.

FIGS. 12A to 17A show the memory switching characteristics similarly to Examples 1 to 5 and Comparative Examples 1 and 2 above. On the other hand, in FIGS. 12B to 17B, although FIGS. 12B to 15B (Examples 6 to 9) each show the excellent characteristics of dielectric strength, FIGS. 16B and 17B (Comparative Examples 3 and 4) each show the degradation of the memory characteristics due to the deterioration of the resistance change layer. This is evident through a comparison between Example 6 and Comparative Example 3, and between Example 8 and Comparative Example 4, each in which their resistance change layers have the same thickness and composition. Accordingly, providing fluoride or phosphorus to the lower electrode 11 was confirmed to improve the characteristics of dielectric strength, and to protect the memory characteristics from degradation.

While the present disclosure has been described in detail, the foregoing description is in all aspects illustrative and not restrictive. It is understood that numerous other modifications and variations are to be possibly devised.

For example, the materials of the layers, the film-forming methods and conditions, and others described in the embodiments and others above are surely not restrictive, and any other materials, or any other film-forming methods will also do. Moreover, in the embodiments and others described above, the configurations of the memory elements 1, 2, and 3, and that of the memory cell array 4 are specifically described. However, all of the layers are not necessarily provided, or any other layers may be also provided.

Note that the present technology is also available with the configurations as below.

1. A memory element including a first electrode, a memory layer, and a second electrode in this order, wherein the memory layer includes a resistance change layer containing fluoride, and an ion source layer disposed between the resistance change layer and the second electrode.

2. The memory element described in 1 above, wherein the resistance change layer contains one or more of magnesium fluoride ($MgF_2$), aluminum fluoride ($AlF_3$), calcium fluoride ($CaF_2$), and lithium fluoride (LiF).

3. The memory element described in 1 or 2 above, wherein the resistance change layer contains oxygen.

4. A memory element including a first electrode, a memory layer, and a second electrode in this order, wherein the memory layer includes a resistance change layer on the first electrode side, and an ion source layer disposed between the resistance change layer and the second electrode, and the first electrode contains fluorine (F) or phosphorus (P).

5. The memory element described in 4 above, wherein the resistance change layer also contains fluorine or phosphorus.

6. The memory element described in 4 or 5 above, further including a fluoride oxide film or a phosphorus oxide film being in contact with the first electrode and disposed between the first electrode and the resistance change layer.

7. The memory element described in any one of 1 to 6 above, wherein the ion source layer contains one or more metallic elements of copper (Cu), aluminum (Al), germanium (Ge), and zinc (Zn), and one or more of oxygen (O), tellurium (Te), sulfur (S), and selenium (Se).

8. The memory element described in any one of 1 to 7 above, wherein the ion source layer contains one or more of transition metals in a group consisting of titanium (Ti), zirconium (Zr), hafnium (Hf), vanadium (V), niobium (Nb), tantalum (Ta), chromium (Cr), molybdenum (Mo), and tungsten (W).

9. The memory element described in any one of 1 to 8 above, wherein the ion source layer includes an intermediate layer, and an ion supply layer disposed between the second electrode and the intermediate layer, the ion supply layer contains one or more metallic elements of copper, aluminum, germanium, and zinc, one or more of oxygen, tellurium, sulfur, and selenium, and one or more of transition metals in a group consisting of titanium, zirconium, hafnium, vanadium, niobium, tantalum, chromium, molybdenum, and tungsten, and the intermediate layer contains one or more of the metallic elements in the ion supply layer, and one or more of oxygen, tellurium, sulfur, and selenium.

10. The memory element described in 9 above, wherein in the intermediate layer, a ratio of the metallic element to a content of oxygen, tellurium, sulfur, and selenium is smaller than a ratio of the metallic element to a content of oxygen, tellurium, sulfur, and selenium in the ion supply layer.

11. The memory element described in any one of 1 to 10 above, wherein storage of information is performed by a change of resistance state of the resistance change layer in response to movement of the metallic element in the ion source layer by application of a voltage to the first and second electrodes.

12. A method of manufacturing a memory element including forming a first electrode by provision of fluorine (F) or phosphorus (P), forming a memory layer by providing a resistance change layer and an ion source layer in this order on the first electrode, and forming a second electrode on the memory layer.

13. The method of manufacturing a memory element described in 12 above, wherein after providing the first electrode with fluorine or phosphorus, forming a fluoride oxide film or a phosphorus oxide film being in contact with the first electrode between the first electrode and the resistance change layer.

14. A memory device including a plurality of memory elements each including a first electrode, a memory layer, and a second electrode in this order, and a pulse application section applying a voltage or current pulse selectively to the memory elements, wherein the memory layer includes a resistance change layer containing fluoride, and an ion source layer disposed between the resistance change layer and the second electrode.

15. A memory device including a plurality of memory elements each including a first electrode, a memory layer, and a second electrode in this order, and a pulse application section applying a voltage or current pulse selectively to the memory elements, wherein the memory layer includes a resistance change layer on the first electrode side, and an ion source layer disposed between the resistance change layer and the second electrode, and the first electrode contains fluorine (F) or phosphorus (P).

The present disclosure contains subject matter related to that disclosed in Japanese Priority Patent Application JP 2010-276749 filed in the Japan Patent Office on Dec. 13, 2010, and in Japanese Priority Patent Application JP 2011-124610 filed in the Japan Patent Office on Jun. 2, 2011, the entire content of which is hereby incorporated by reference.

What is claimed is:

1. A memory element, comprising:
a first electrode;
a second electrode; and
a memory layer between the first and second electrodes, wherein,
the memory layer includes (a) a resistance change layer comprising an oxidized chemical compound containing fluoride, and (b) an ion source layer between the resistance change layer and the second electrode,
the resistance change layer changes resistance in response to (a) an insertion of mobile ions of into the resistance change layer from the ion source layer or (b) an extractions of the mobile ions from the resistance change layer, and
the resistance change layer is longer than the first electrode along a direction perpendicular to a thickness direction of the memory element.

2. The memory element according to claim 1, wherein the resistance change layer contains one or more of magnesium fluoride ($MgF_2$), aluminum fluoride ($AlF_3$), calcium fluoride ($CaF_2$), and lithium fluoride (LiF).

3. The memory element according to claim 1, wherein the resistance change layer contains oxygen.

4. The memory element according to claim 1, wherein the ion source layer contains one or more metallic elements of copper (Cu), aluminum (Al), germanium (Ge), and zinc (Zn), and one or more of oxygen (O), tellurium (Te), sulfur (S), and selenium (Se).

5. The memory element according to claim 4, wherein the ion source layer contains one or more of transition metals in a group consisting of titanium (Ti), zirconium (Zr), hafnium (Hf), vanadium (V), niobium (Nb), tantalum (Ta), chromium (Cr), molybdenum (Mo), and tungsten (W).

6. The memory element according to claim 1, wherein:
the ion source layer includes an intermediate layer and an ion supply layer disposed between the second electrode and the intermediate layer,
the ion supply layer contains one or more metallic elements of copper, aluminum, germanium, and zinc, one or more of oxygen, tellurium, sulfur, and selenium, and one or more of transition metals in a group consisting of titanium, zirconium, hafnium, vanadium, niobium, tantalum, chromium, molybdenum, and tungsten, and
the intermediate layer contains one or more of the metallic elements in the ion supply layer and one or more of oxygen, tellurium, sulfur, and selenium.

7. The memory element according to claim 6, wherein in the intermediate layer, a ratio of the metallic element to a content of the one or more of oxygen, tellurium, sulfur, and selenium is smaller than a ratio of the metallic element to a content of the one or more of oxygen, tellurium, sulfur, and selenium in the ion supply layer.

8. The memory element according to claim 1, wherein storage of information is performed by a change of a resistance state of the resistance change layer in response to movement of the ions of the ion source layer by application of a voltage to the first and second electrodes.

9. The memory element according to claim 1, wherein the resistance change layer has an initial resistance within a range that is inclusive of $1\Omega$ to $1\ G\Omega$.

10. A memory element, comprising:
a first electrode;
a second electrode; and
a memory layer between the first and second electrodes, wherein,
the memory layer includes (a) a resistance change layer comprising an oxidized chemical compound containing fluoride, the resistance change layer being on the first electrode side, and (b) an ion source layer between the resistance change layer and the second electrode,
the resistance change layer changes resistance in response to (a) an insertion of mobile ions of into the resistance change layer from the ion source layer or (b) an extraction of the mobile ions from the resistance change layer,
the resistance change layer is longer than the first electrode along a direction perpendicular to a thickness direction of the memory element, and
the first electrode comprises (i) one of tungsten, tungsten nitride, titanium nitride, copper, aluminum, molybdenum, tantalum, and silicide, and (ii) one of fluorine (F) and phosphorus (P).

11. The memory element according to claim 10, further comprising:
a fluoride oxide film or a phosphorus oxide film being in contact with the first electrode and disposed between the first electrode and the resistance change layer.

12. A memory device, comprising:
a plurality of memory elements, each memory element including a first electrode, a portion of a memory layer, and a a portion of a second electrode in this order; and
a pulse application section configured to apply a voltage or current pulse selectively to the memory elements,
wherein,
the memory layer includes (a) a resistance change layer comprising an oxidized chemical compound containing fluoride, and (b) an ion source layer between the resistance change layer and the second electrode,
for each of the plurality of memory elements, the resistance change layer changes resistance in response to (a) an insertion of mobile ions into the resistance change layer from the ion source layer or (b) an extraction of the mobile ions from the resistance change layer, and
the first electrodes are provided individually for the plurality of memory elements.

13. A memory device, comprising:
a plurality of memory elements, each memory element including a first electrode, a portion of a memory layer, and a portion of a second electrode in this order; and
a pulse application section configured to apply a voltage or current pulse selectively to the memory elements,
wherein
the memory layer includes (a) a resistance change layer comprising an oxidized chemical compound containing fluoride, the resistance change layer being on a side of the first electrode, and (b) an ion source layer between the resistance change layer and the second electrode,
for each of the plurality of memory elements, the resistance change layer changes resistance in response to (a) an insertion of mobile ions into the resistance change layer from the ion source layer, or (b) an extraction of the mobile ions from the resistance change layer,
the first electrodes are provided individually for the plurality of memory elements, and
for each of the plurality of memory elements, the first electrode comprises (i) one of tungsten, tungsten nitride, titanium nitride, copper, aluminum, molybdenum, tantalum, and silicide and (ii) one of fluorine (F) and phosphorus (P).

* * * * *